(12) United States Patent
Leobandung

(10) Patent No.: US 10,418,493 B2
(45) Date of Patent: Sep. 17, 2019

(54) TIGHT PITCH STACK NANOWIRE ISOLATION

(71) Applicant: INTERNATIONAL BUSINESS MACHINES CORPORATION, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/847,296

(22) Filed: Dec. 19, 2017

(65) Prior Publication Data

US 2019/0189806 A1    Jun. 20, 2019

(51) Int. Cl.

| H01L 29/786 | (2006.01) |
| H01L 29/66 | (2006.01) |
| H01L 21/02 | (2006.01) |
| H01L 29/423 | (2006.01) |
| H01L 21/306 | (2006.01) |
| H01L 21/762 | (2006.01) |
| H01L 29/06 | (2006.01) |

(52) U.S. Cl.
CPC .. H01L 29/78696 (2013.01); H01L 21/02532 (2013.01); H01L 21/02603 (2013.01); H01L 21/30604 (2013.01); H01L 21/76224 (2013.01); H01L 29/0649 (2013.01); H01L 29/0673 (2013.01); H01L 29/42392 (2013.01); H01L 29/66545 (2013.01); H01L 29/66742 (2013.01)

(58) Field of Classification Search
CPC ....... H01L 21/823481; H01L 29/42392; H01L 29/66545
See application file for complete search history.

(56) References Cited

U.S. PATENT DOCUMENTS

| 8,541,274 | B1 | 9/2013 | Xie et al. |
| 8,994,081 | B2 | 3/2015 | Leobandung |
| 9,257,545 | B2 | 2/2016 | Leobandung |
| 9,276,064 | B1 | 3/2016 | Zang et al. |
| 9,324,812 | B2 | 4/2016 | Yang et al. |
| 9,419,102 | B1 | 8/2016 | Leobandung |
| 9,450,046 | B2 * | 9/2016 | Wen ................ H01L 21/02532 |
| 9,659,829 | B1 | 5/2017 | Balakrishnan et al. |

(Continued)

OTHER PUBLICATIONS

Dupre, "15nm-diameter 3d Stacked Nanowires with Independent Gate Operations ΦFet", Electron Devices Meeting, 2008. IEDM 2008. IEEE International, Dec. 15-17, 2008, 4 pages.

*Primary Examiner* — Dung A. Le
(74) *Attorney, Agent, or Firm* — Tutunjian & Bitetto, P.C.; Vazken Alexanian

(57) ABSTRACT

Devices and methods for forming a tight pitch stack nanowire without shallow trench isolation including a base nanosheet formed on a substrate. At least one fin are formed, and at least one dummy gate is formed over the at least two fins, on the base nanosheet, the at least two fins including at least two alternating layers of a first material and a second material. The base nanosheet is replaced with a blanket dielectric to form a shallow trench isolation (STI) around the at least one fin and around the at least one dummy gate. A gate replacement is performed to replace the at least one dummy gate and the second material with a gate conductor material and a gate cap to form gate structures.

16 Claims, 25 Drawing Sheets

(56) References Cited

U.S. PATENT DOCUMENTS

| | | |
|---|---|---|
| 9,685,539 B1 | 6/2017 | Cheng et al. |
| 9,984,936 B1* | 5/2018 | Xie ...................... H01L 29/775 |
| 2017/0141212 A1* | 5/2017 | Barraud ............ H01L 21/02667 |
| 2017/0222006 A1 | 8/2017 | Suh et al. |

* cited by examiner

TIGHT PITCH STACK NANOWIRE ISOLATION

BACKGROUND

Technical Field

The present invention generally relates to semiconductor transistors, and more particularly to stacked nanowires and stacked nanosheet transistors.

Description of the Related Art

As the industry moves towards smaller and smaller semiconductor devices, alternative structures are being researched. Fin-type field effect transistors, for example, enable transistors with smaller footprints, thus permitting more transistors on a given device. However, as the transistors on a chip get smaller, the fabrication of the transistors reaches limits at which known processes can produce uniform device elements.

For example, in very small transistors, a gap fill step in the fabrication of the transistor is imprecise, due in part to non-uniformity in etching. Thus, performing an etch and gap fill introduces issues with non-uniformity in parts of the transistor, such as a width of the transistor and gate pitch. In a stacked nanowire or stacked nanosheet transistor, etch processes may cause a stack of nanosheets or nanowires to taper towards the top. As a result, the tops of the stacks may become too narrow, or the bases too wide. As a result, transistors cannot currently be reliably produced at these sizes.

SUMMARY

In accordance with an embodiment of the present invention, a method for forming a stacked nanowire transistor is described. The method includes forming a base nanosheet on a substrate. At least one fin is formed, and at least one dummy gate is formed over the at least one fin, on the base nanosheet, the at least one fin including at least two alternating layers of a first material and a second material. The base nanosheet is replaced with a blanket oxide to form a shallow trench isolation (STI) around the at least one fin and around the at least one dummy gate. A gate replacement is performed to replace the at least one dummy gate and the second material with a gate conductor material and a gate cap to form gate structures.

In accordance with another embodiment of the present invention, a method for forming a stacked nanowire transistor is described. The method includes a base nanosheet formed on a substrate. At least two fins, and at least one dummy gate over the at least two fins, are formed on the base nanosheet, the at least two fins including at least two alternating layers of a first material and a second material. The base nanosheet is etched from beneath the at least two fins and the at least one dummy gate to form a cavity beneath the at least two fins and the at least one dummy gate. The cavity is filled with a blanket dielectric to form a shallow trench isolation (STI) beneath and between each of the at least two fins and beneath and around the at least one dummy gate. A gate replacement is performed to replace the at least one dummy gate and the second material with a gate conductor material and a gate cap to form gate structures.

In accordance with another embodiment of the present invention, a semiconductor device is described. The semiconductor device includes an active region including a blanket dielectric nanosheet. Further included are at least one fin formed on the blanket dielectric nanosheet. There is at least one gate structure formed over the at least one fin in the active region such that the blanket dielectric nanosheet forms an insulating layer between each of the at least one fin and the at least one gate structure, and a substrate such that each of the at least one fin and each of the at least one dummy gate are electrically isolated.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

Figure 16:
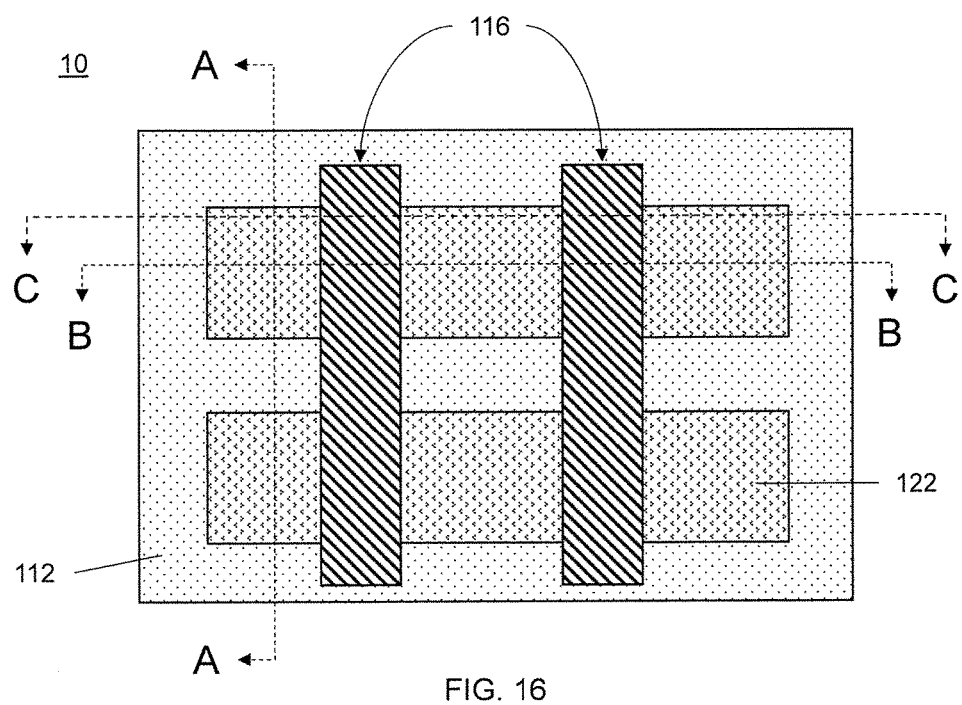
Figure 17:
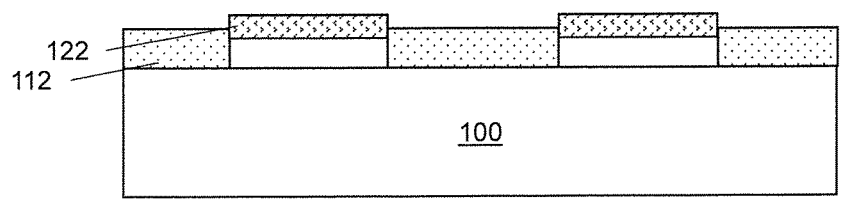
Figure 18:
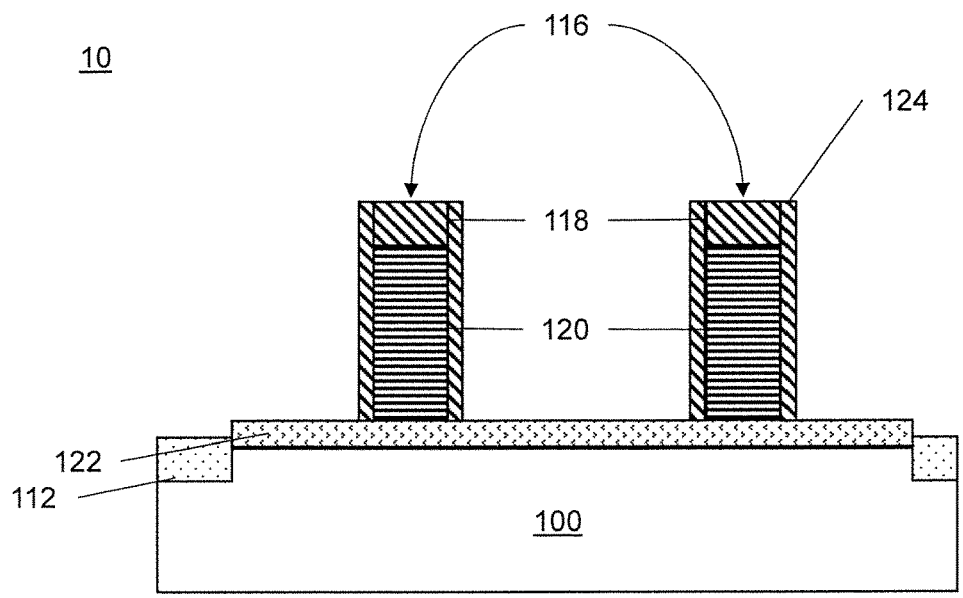
Figure 19:
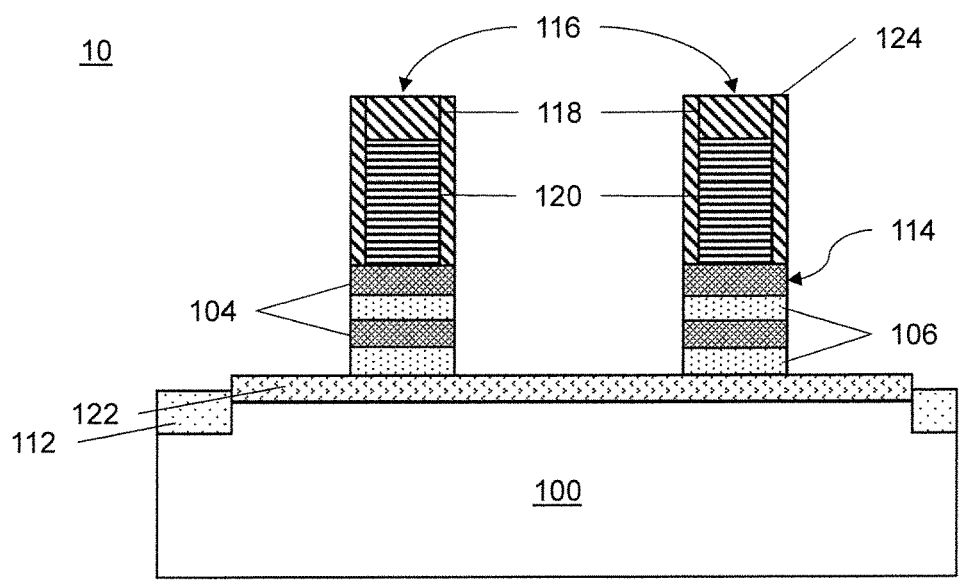
Figure 20:
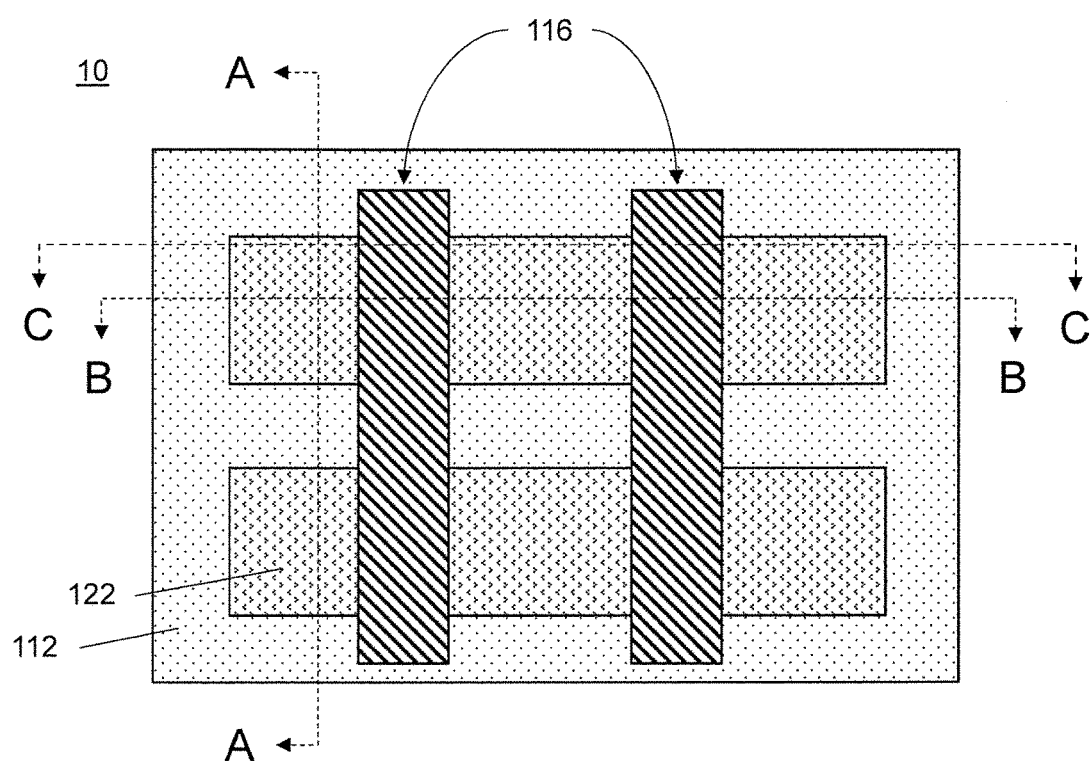
Figure 21:
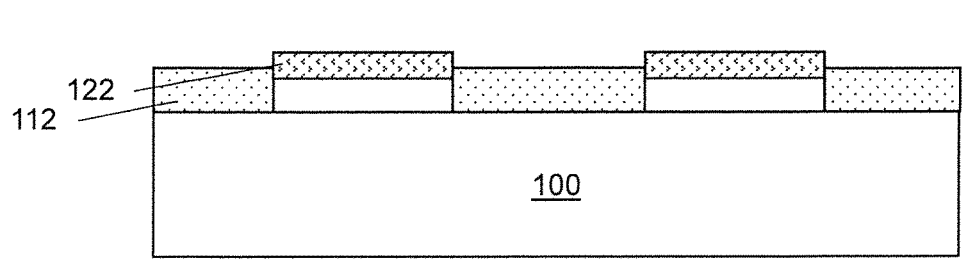
Figure 22:
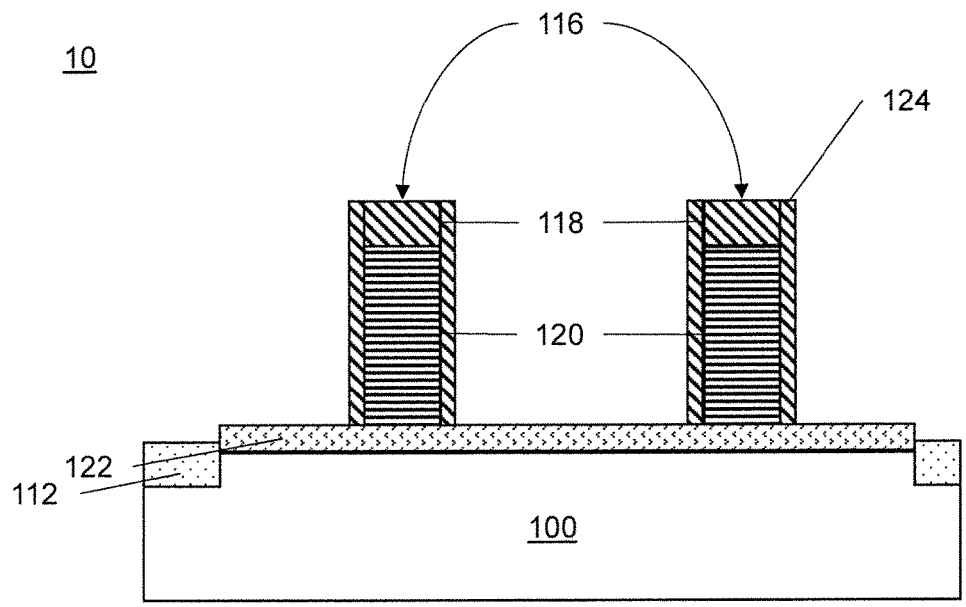
Figure 23:
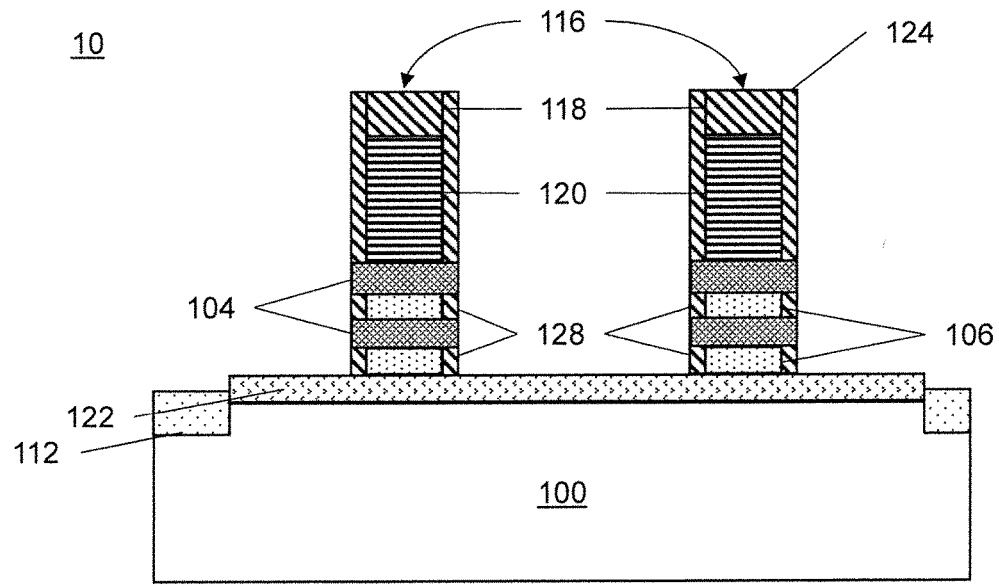
Figure 24:
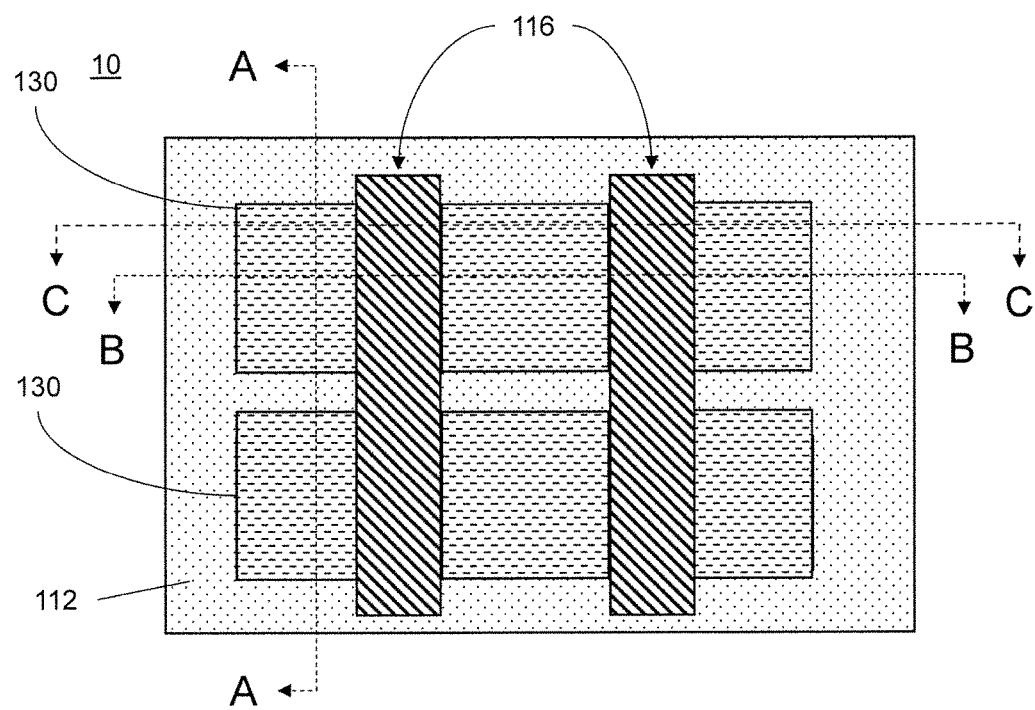
Figure 25:
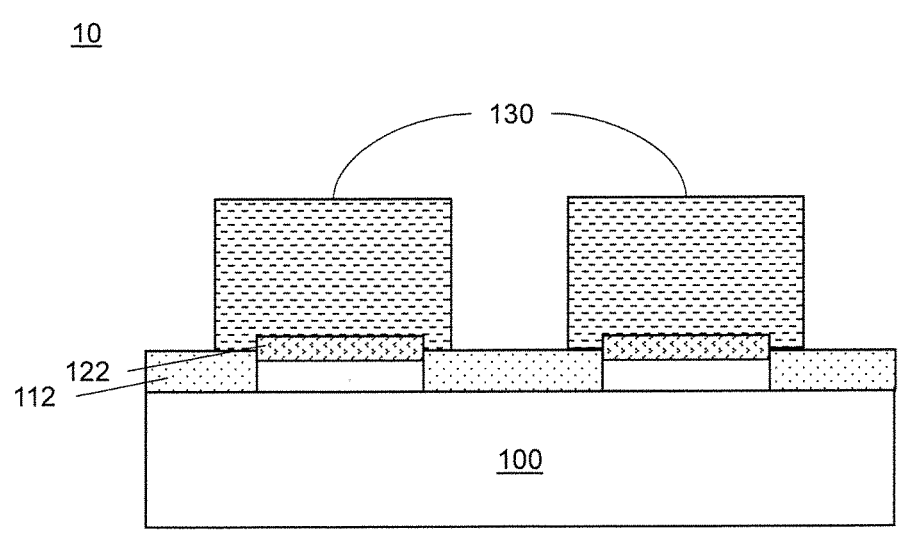
Figure 26:
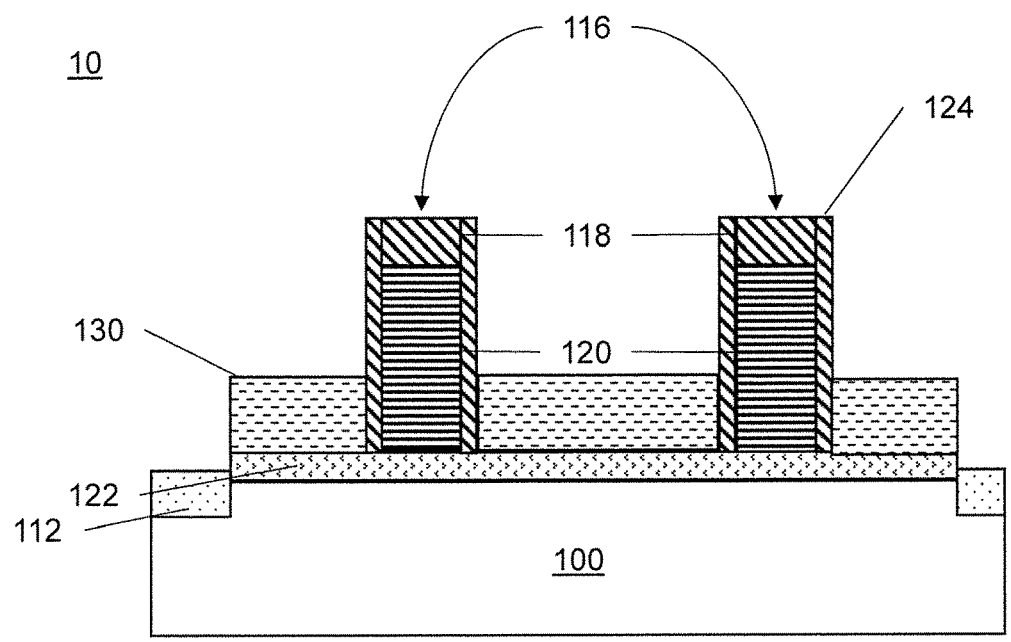
Figure 27:
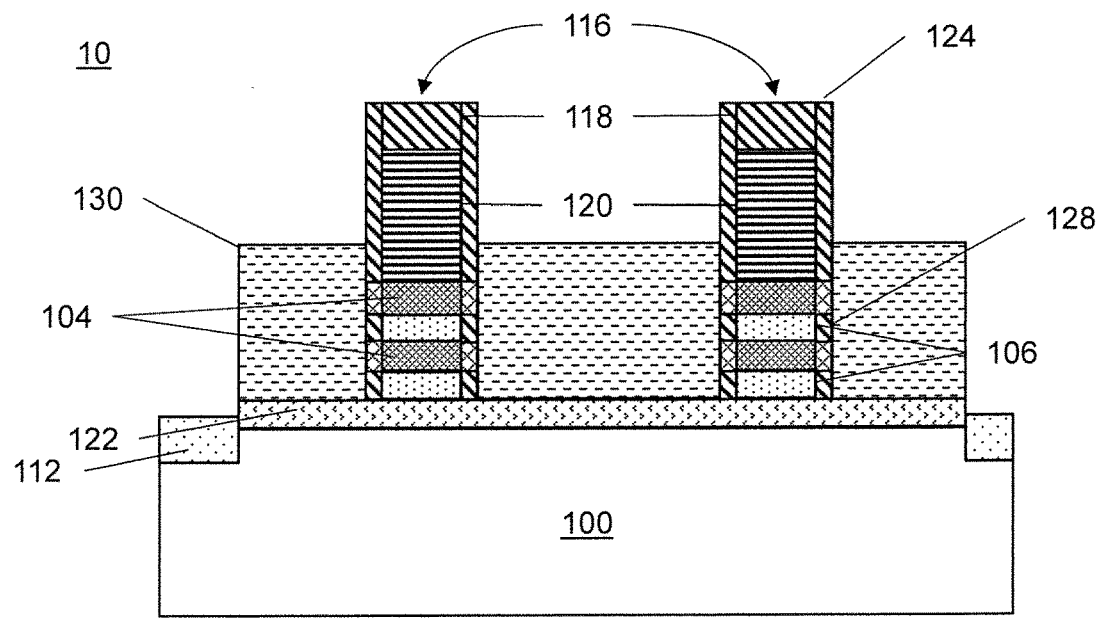
Figure 28:
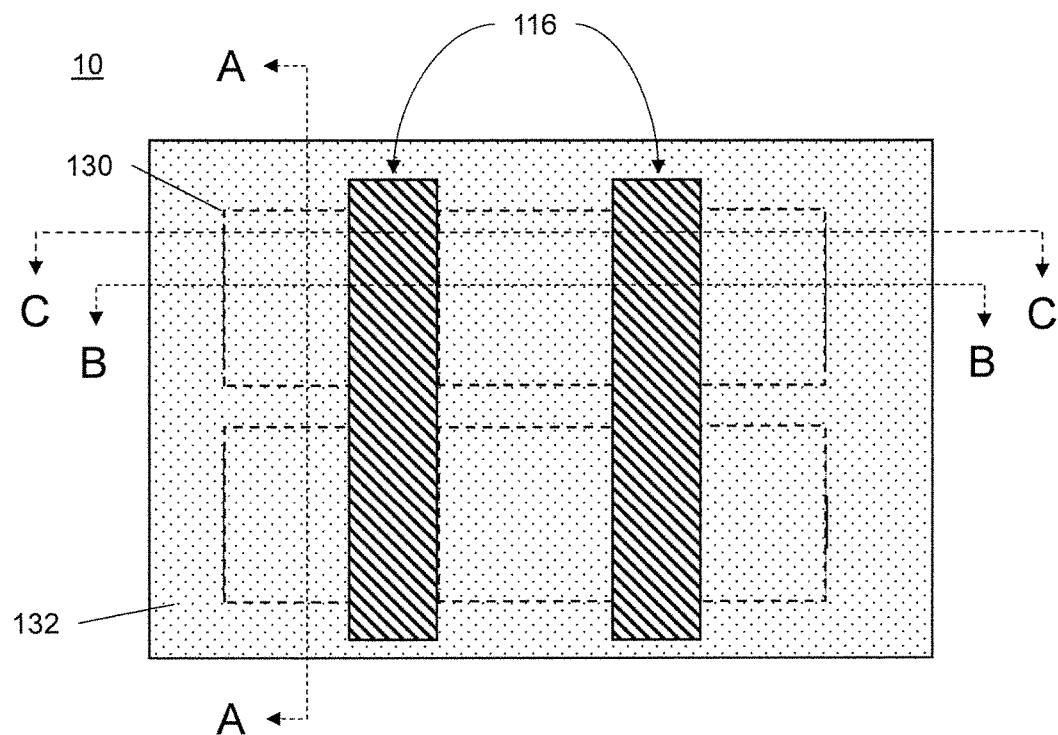
Figure 29:
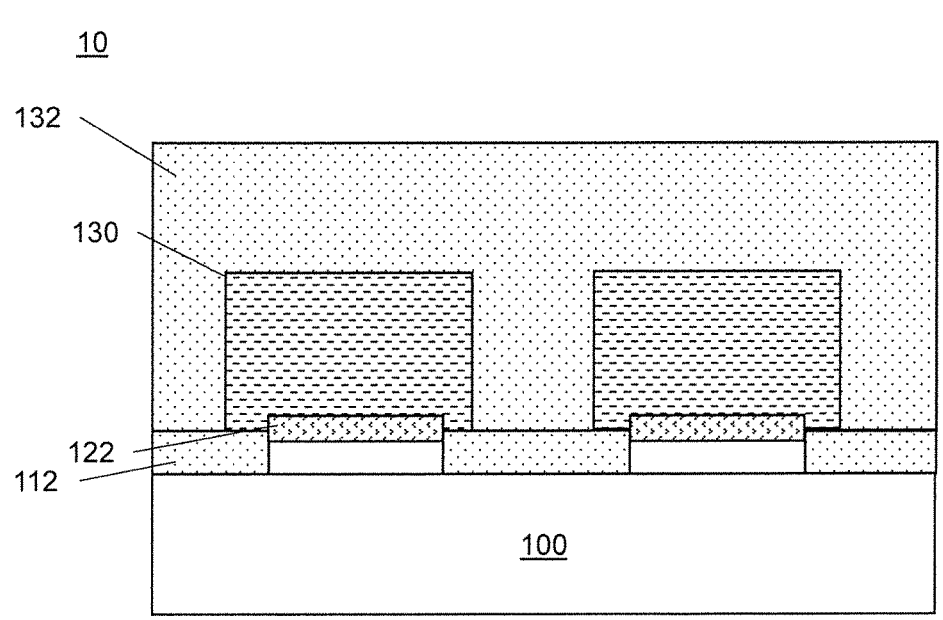
Figure 30:
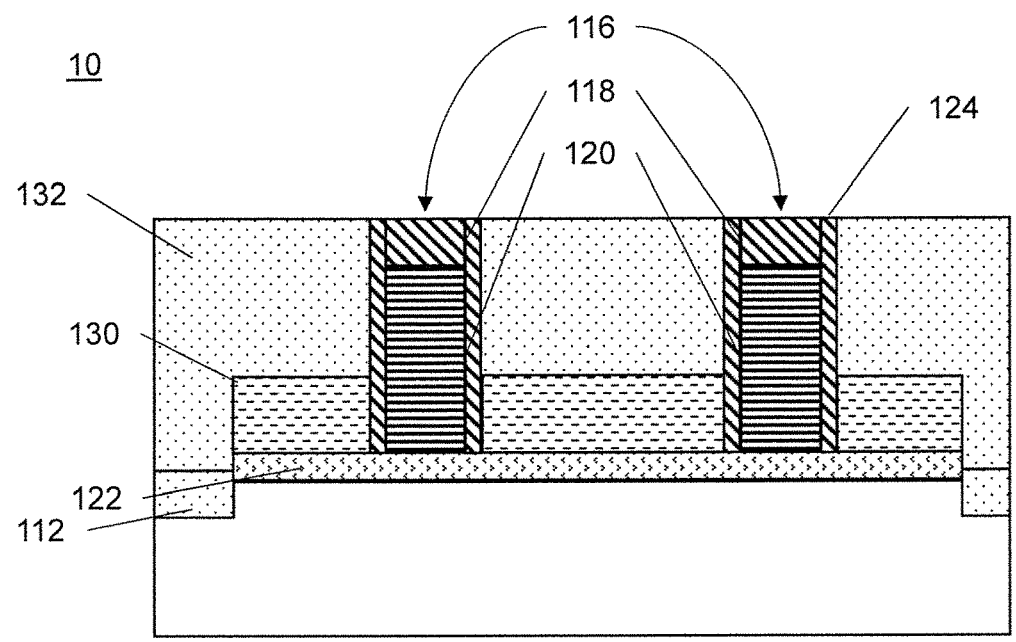
Figure 31:
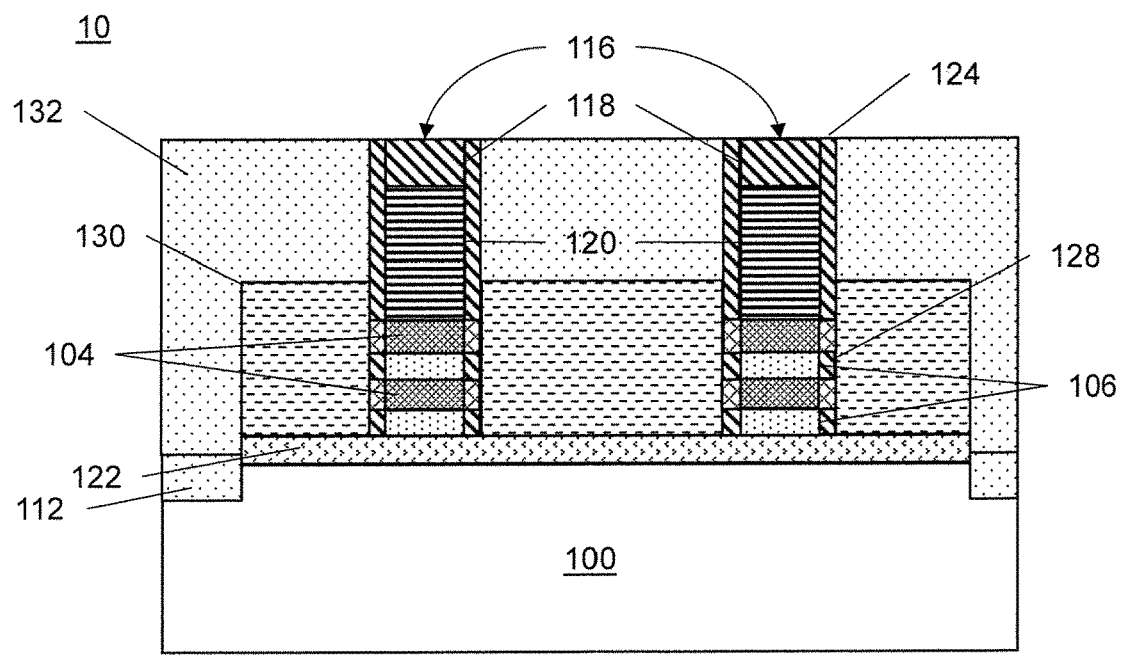
Figure 32:
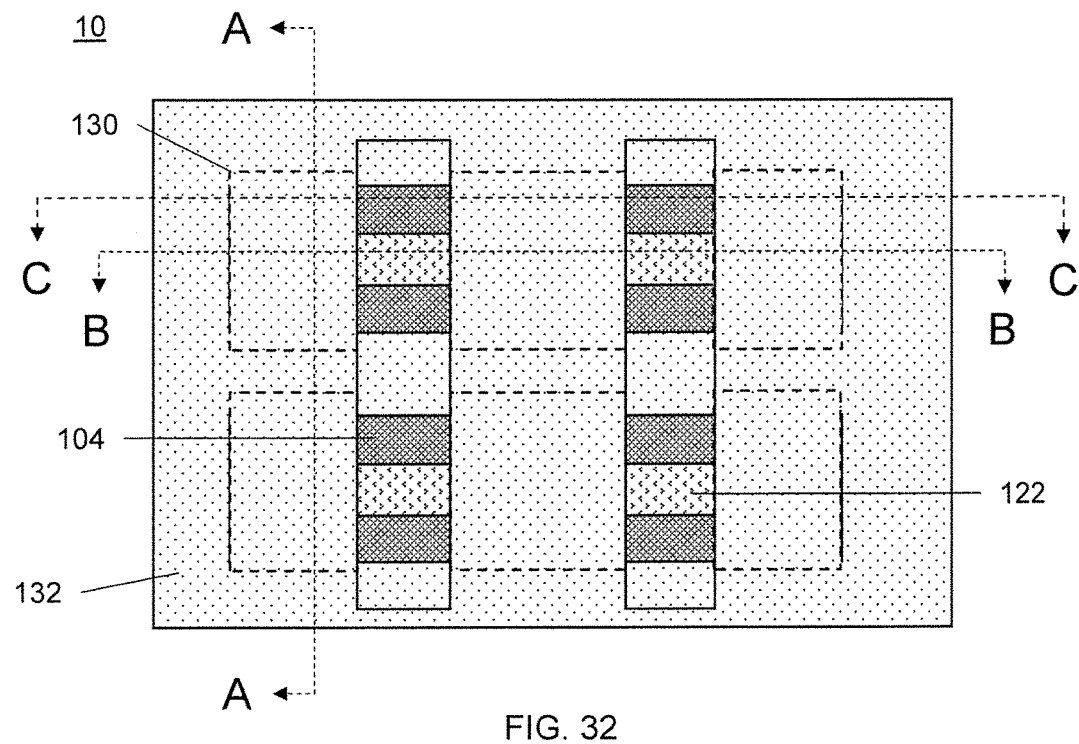
Figure 33:
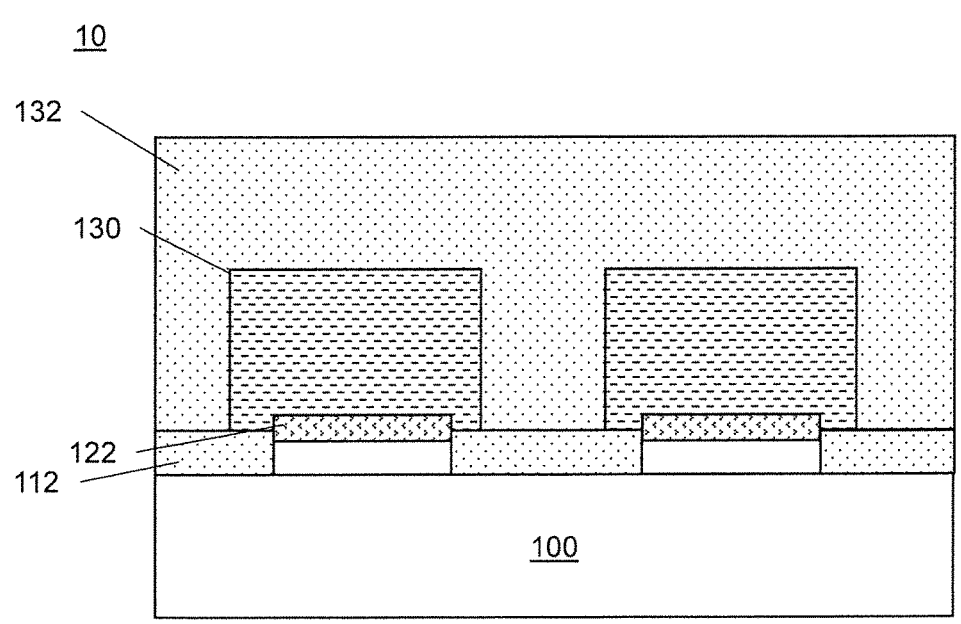
Figure 34:
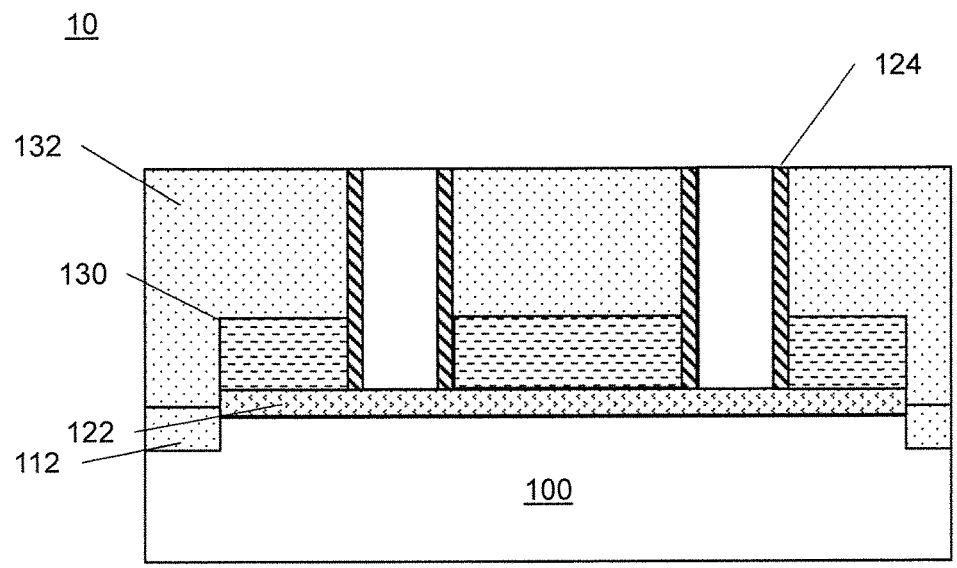
Figure 35:
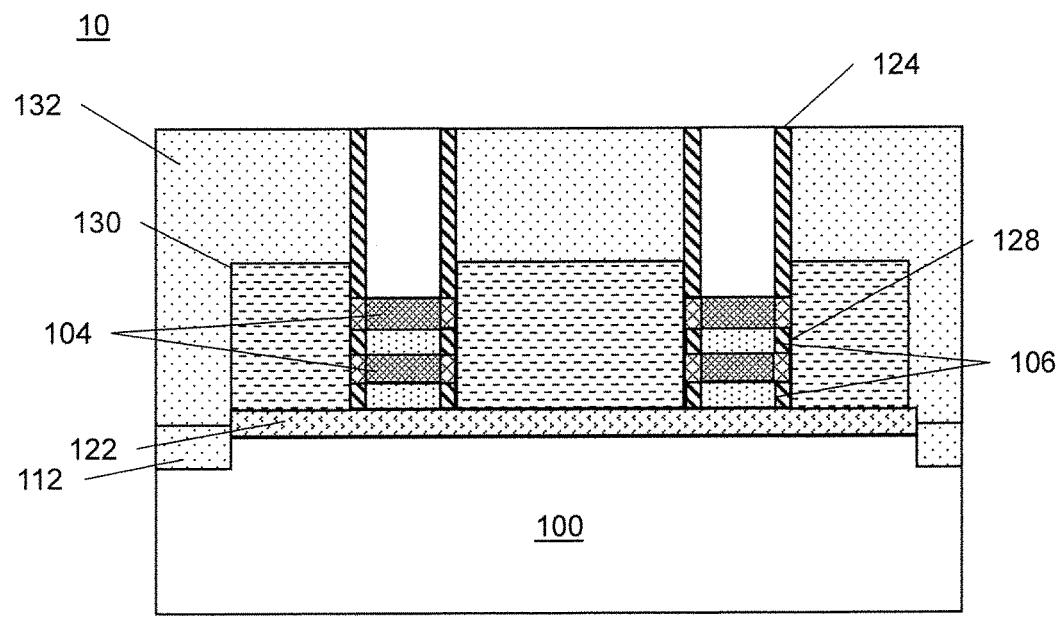
Figure 36:
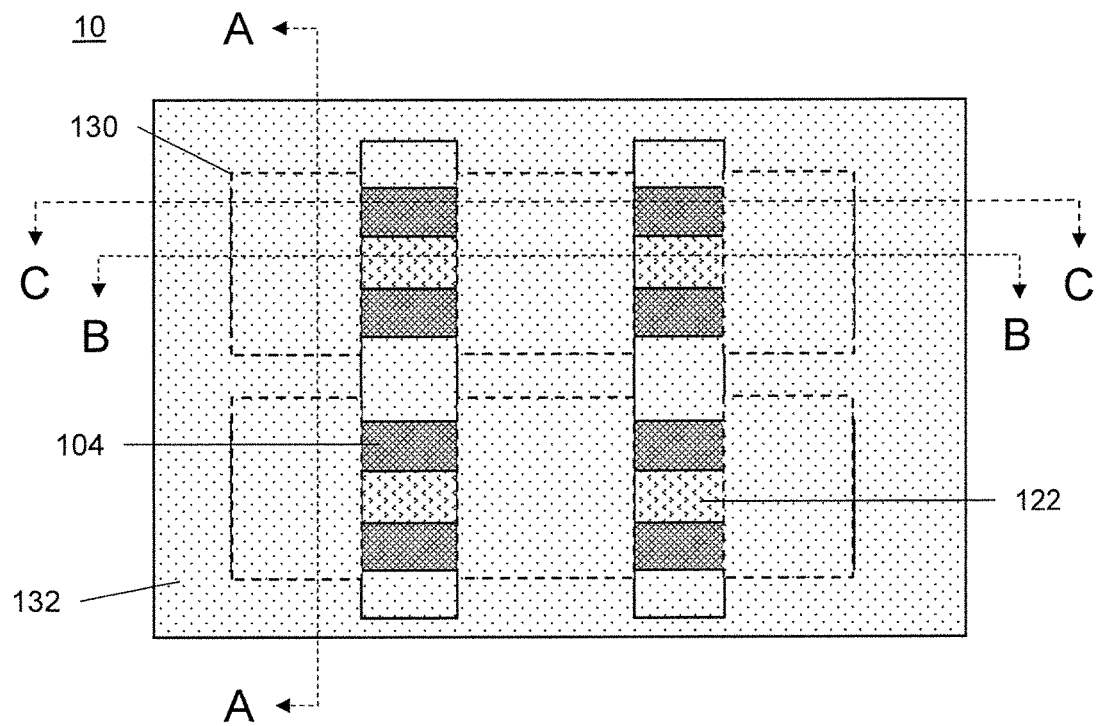
Figure 37:
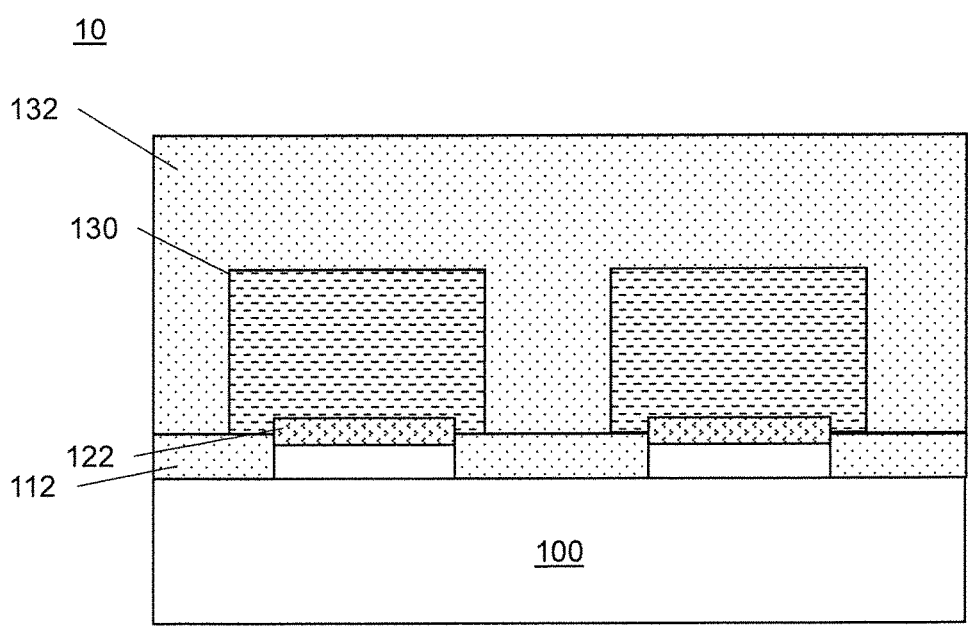
Figure 38:
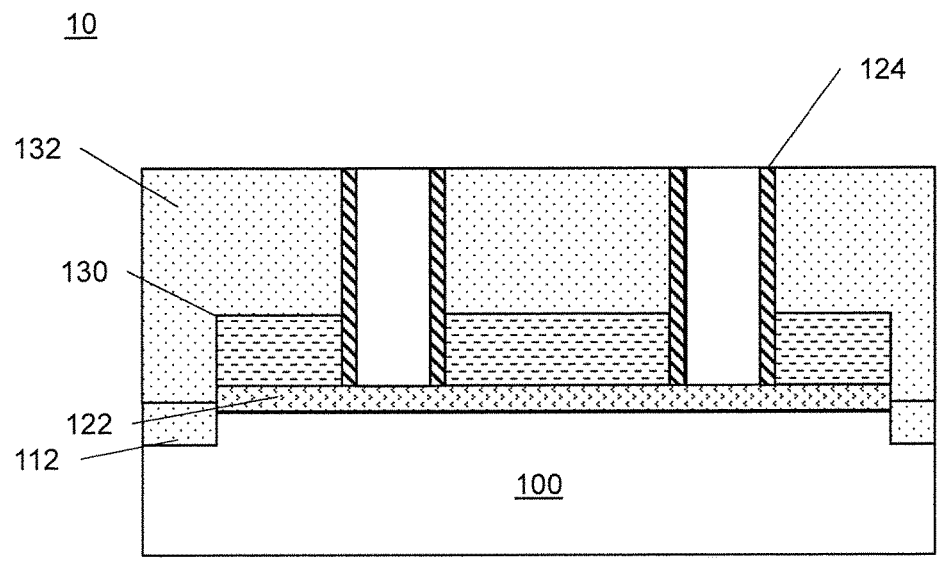
Figure 39:
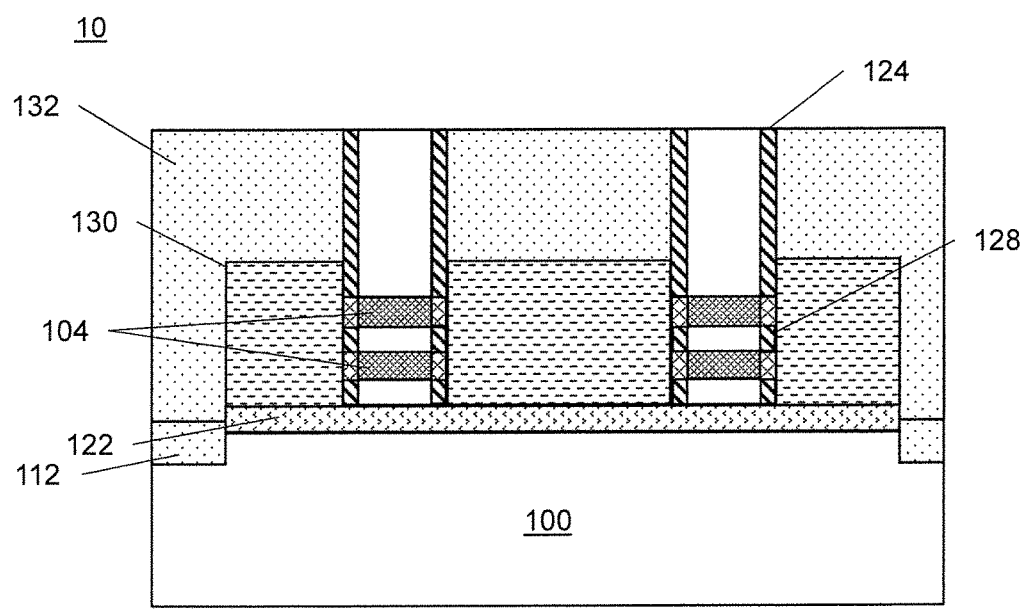
Figure 40:
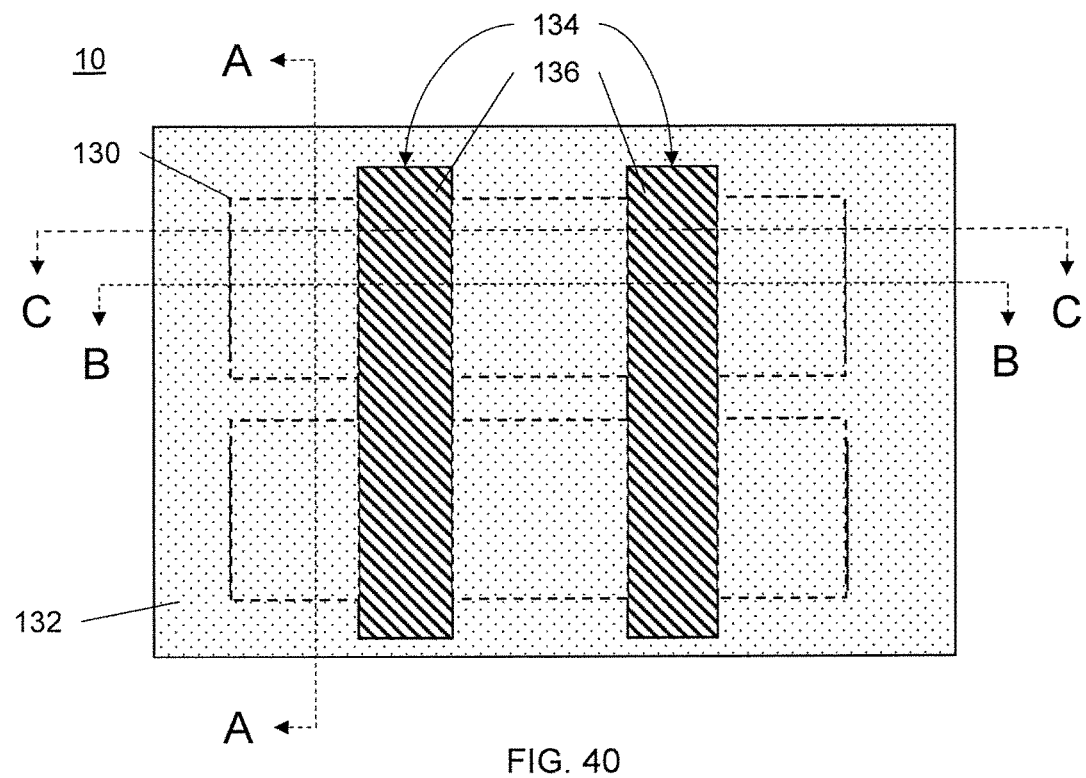
Figure 41:
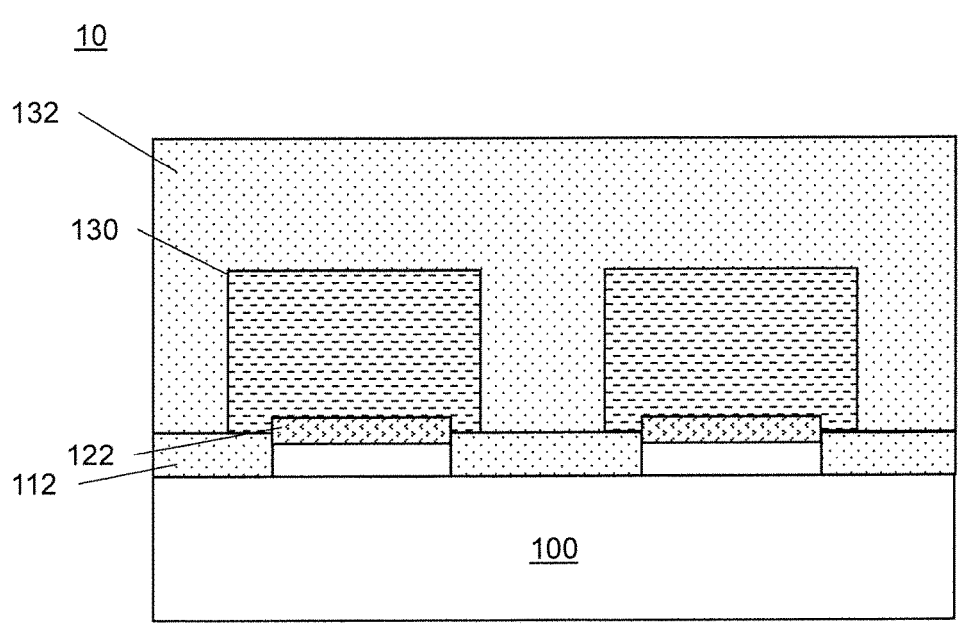
Figure 42:
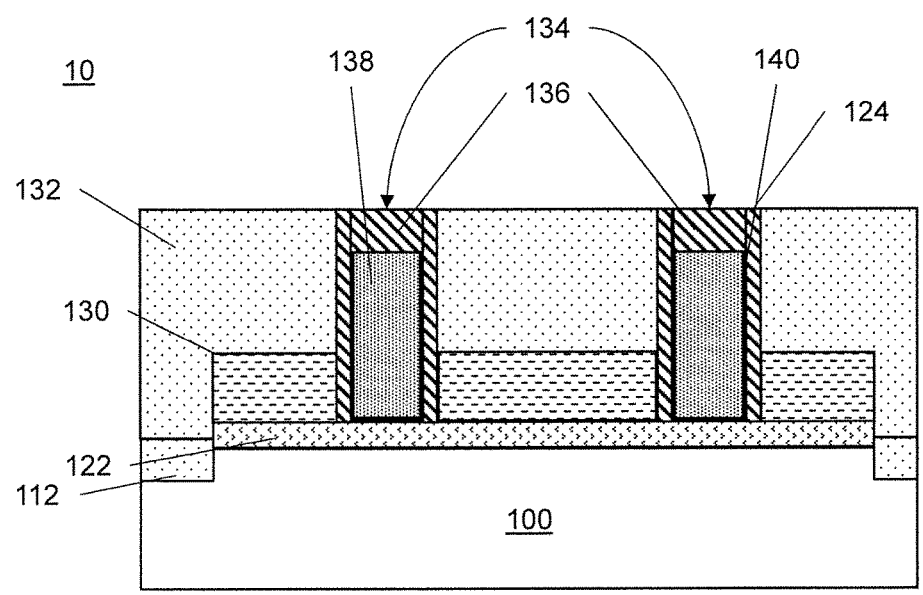
Figure 43:
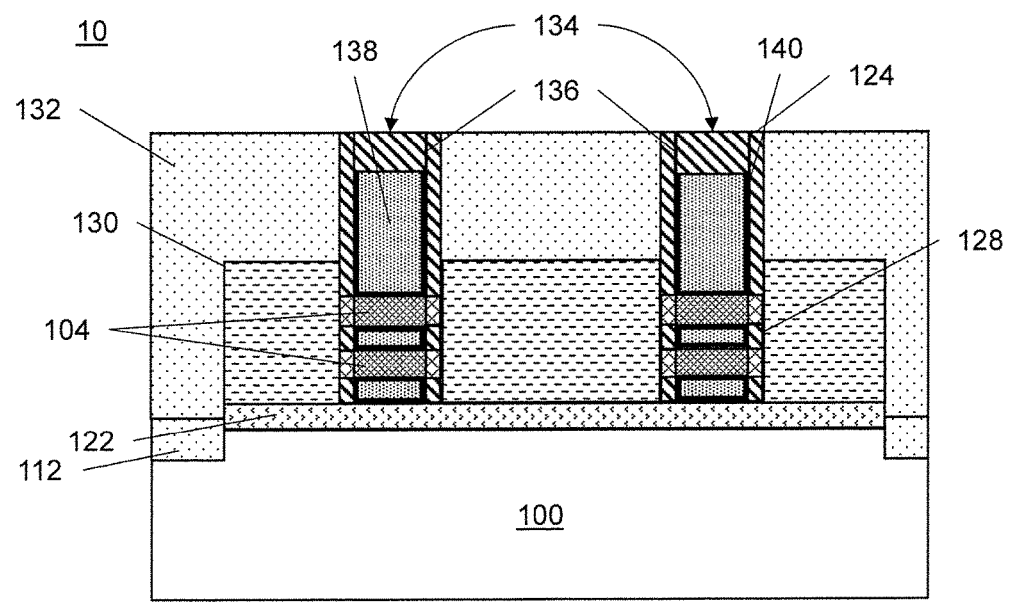
Figure 44:
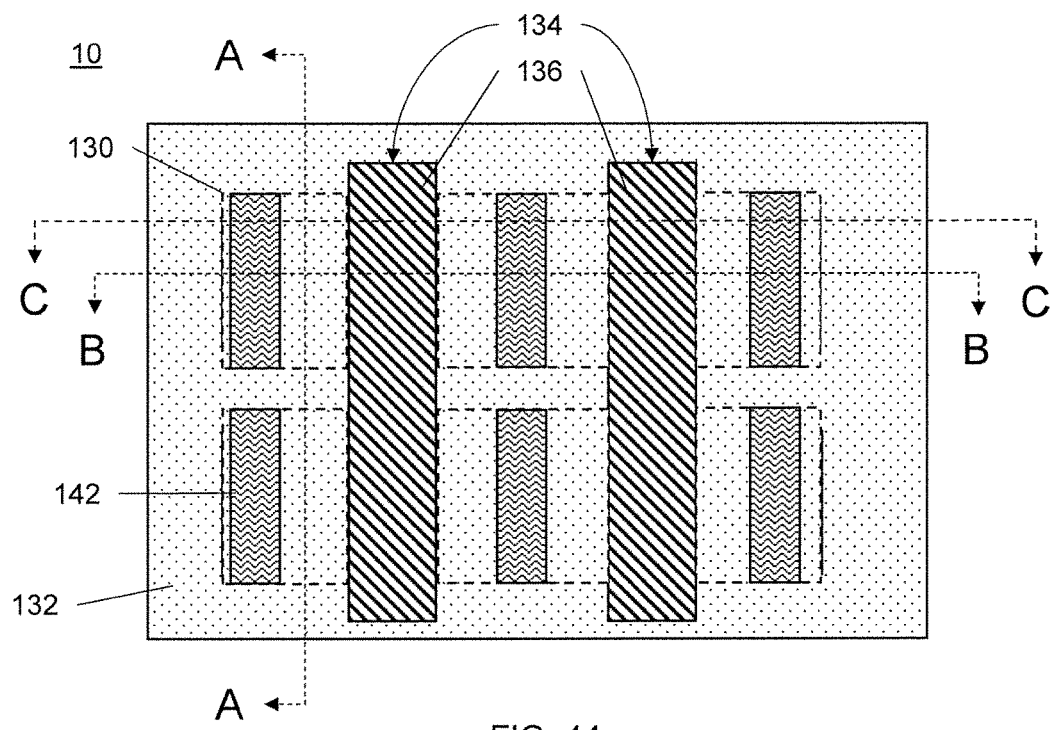
Figure 45:
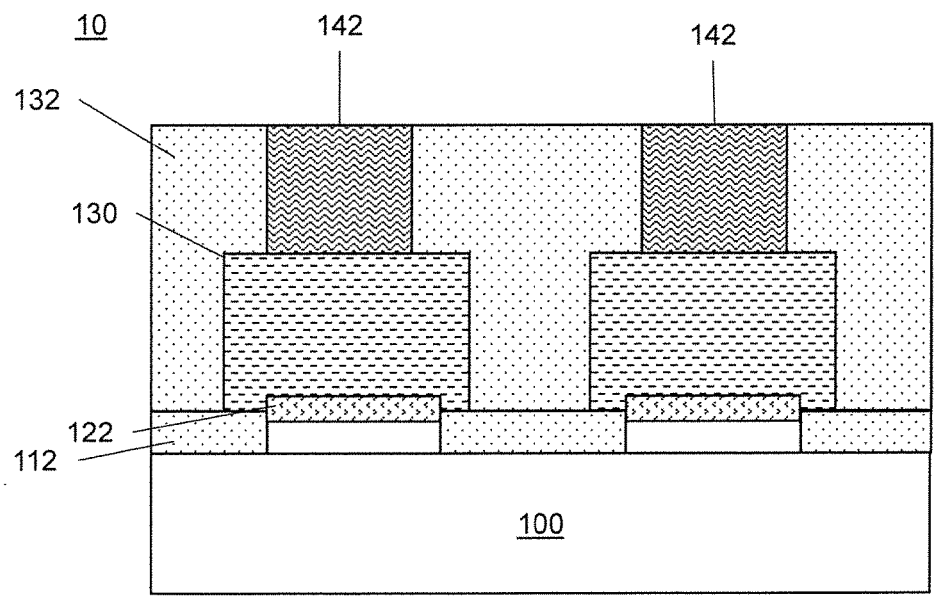
Figure 46:
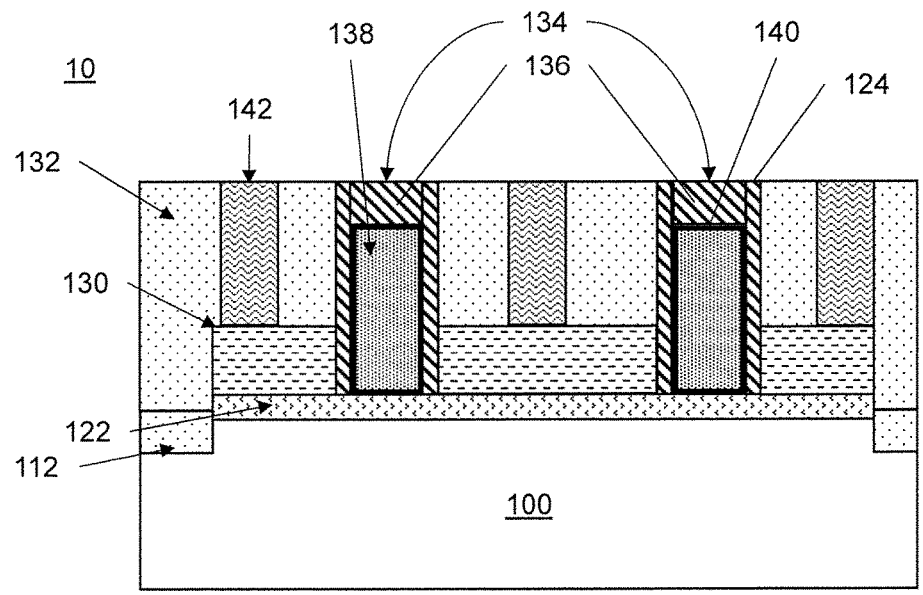
Figure 47:
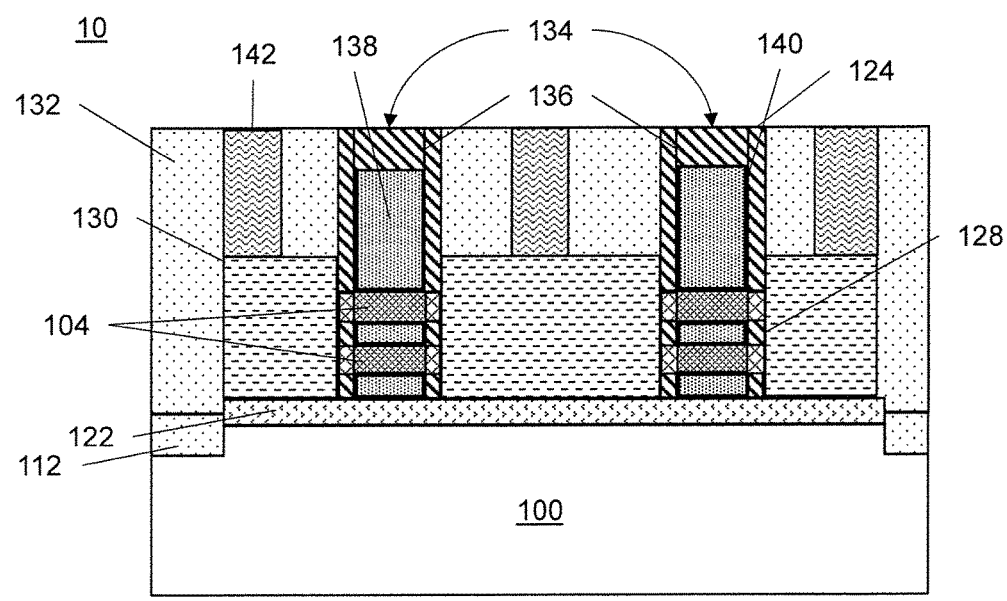
Figure 48:
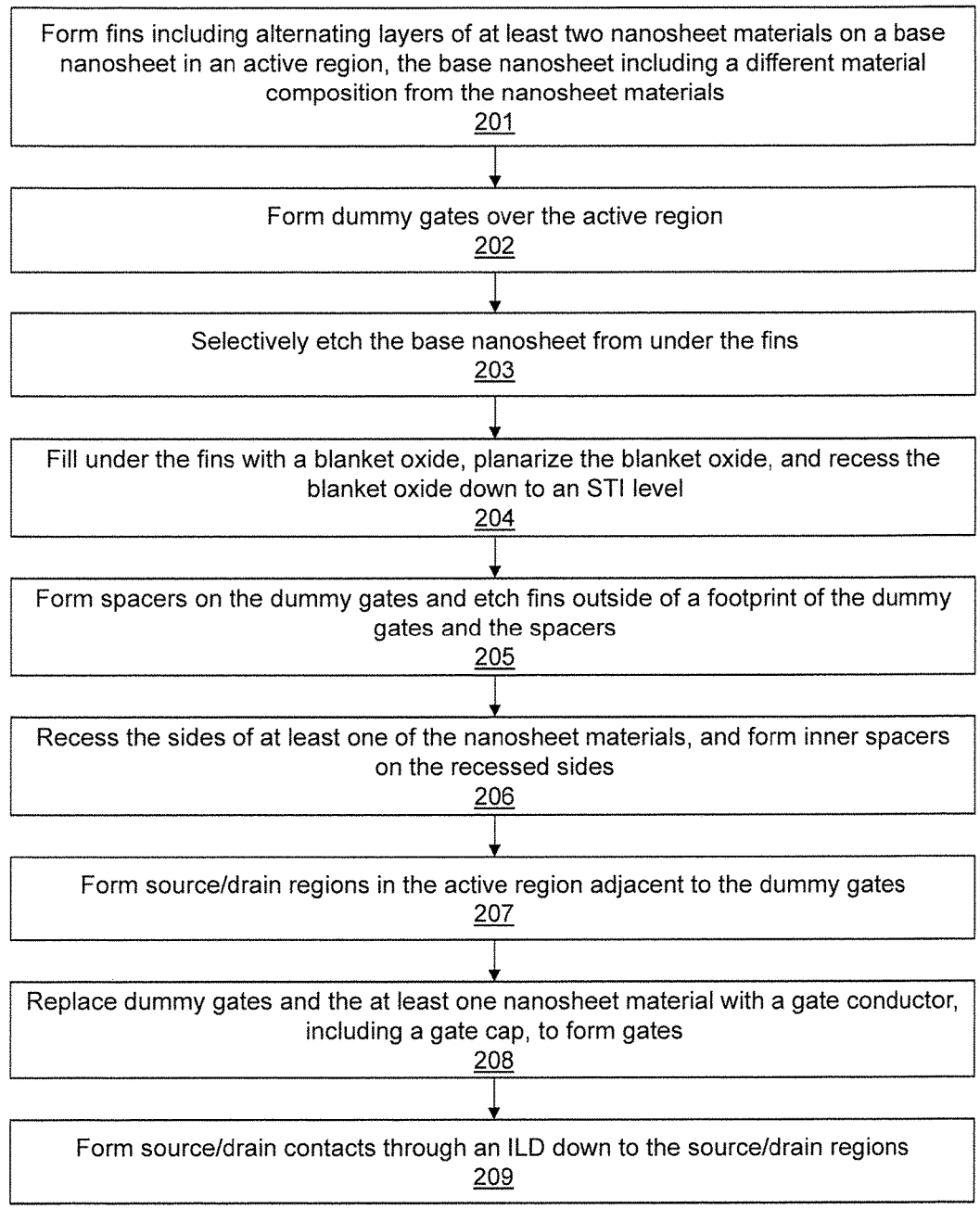

FIG. 16 is a top view of the fins of the device of FIGS. 12-15 removed outside of a footprint of the dummy gates with gate spacers formed thereon, in accordance with an embodiment of the present invention;

FIG. 17 is a cross-sectional view along line A-A of FIG. 16 of the fins of the device of FIGS. 12-15 removed outside of a footprint of the dummy gates with gate spacers formed thereon, in accordance with an embodiment of the present invention;

FIG. 18 is a cross-sectional view along line B-B of FIG. 16 of the fins of the device of FIGS. 12-15 removed outside of a footprint of the dummy gates with gate spacers formed thereon, in accordance with an embodiment of the present invention;

FIG. 19 is a cross-sectional view along line C-C of FIG. 16 of the fins of the device of FIGS. 12-15 removed outside of a footprint of the dummy gates with gate spacers formed thereon, in accordance with an embodiment of the present invention;

FIG. 20 is a top view showing inner spacers formed on the recessed nanosheet films of the device of FIGS. 16-19, in accordance with an embodiment of the present invention;

FIG. 21 is a cross-sectional view along line A-A of FIG. 20 showing inner spacers formed on the recessed nanosheet films of the device of FIGS. 16-19, in accordance with an embodiment of the present invention;

FIG. 22 is a cross-sectional view along line B-B of FIG. 20 showing inner spacers formed on the recessed nanosheet films of the device of FIGS. 16-19, in accordance with an embodiment of the present invention;

FIG. 23 is a cross-sectional view along line C-C of FIG. 20 showing inner spacers formed on the recessed nanosheet films of the device of FIGS. 16-19, in accordance with an embodiment of the present invention;

FIG. 24 is a top view showing source and drain regions formed on the device of FIGS. 20-23, in accordance with an embodiment of the present invention;

FIG. 25 is a cross-sectional view along line A-A of FIG. 24 showing source and drain regions formed on the device of FIGS. 20-23, in accordance with an embodiment of the present invention;

FIG. 26 is a cross-sectional view along line B-B of FIG. 24 showing source and drain regions formed on the device of FIGS. 20-23, in accordance with an embodiment of the present invention;

FIG. 27 is a cross-sectional view along line C-C of FIG. 24 showing source and drain regions formed on the device of FIGS. 20-23, in accordance with an embodiment of the present invention;

FIG. 28 is a top view showing an interlevel dielectric layer (ILD) formed over the active areas of the device of FIGS. 24-27, in accordance with an embodiment of the present invention;

FIG. 29 is a cross-sectional view along line A-A of FIG. 28 showing an interlevel dielectric layer (ILD) formed over the active areas of the device of FIGS. 24-27, in accordance with an embodiment of the present invention;

FIG. 30 is a cross-sectional view along line B-B of FIG. 28 showing an interlevel dielectric layer (ILD) formed over the active areas of the device of FIGS. 24-27, in accordance with an embodiment of the present invention;

FIG. 31 is a cross-sectional view along line C-C of FIG. 28 showing an interlevel dielectric layer (ILD) formed over the active areas of the device of FIGS. 24-27, in accordance with an embodiment of the present invention;

FIG. 32 is a top showing the dummy gates of the device of FIGS. 28-31 recessed, in accordance with an embodiment of the present invention;

FIG. 33 is a cross-sectional view along line A-A of FIG. 32 the dummy gates of the device of FIGS. 28-31 recessed, in accordance with an embodiment of the present invention;

FIG. 34 is a cross-sectional view along line B-B of FIG. 32 showing the dummy gates of the device of FIGS. 28-31 recessed, in accordance with an embodiment of the present invention;

FIG. 35 is a cross-sectional view along line C-C of FIG. 32 the dummy gates of the device of FIGS. 28-31 recessed, in accordance with an embodiment of the present invention;

FIG. 36 is top view showing the horizontally recessed nanosheet film removed from between the spacers of the device of FIGS. 32-35, in accordance with an embodiment of the present invention;

FIG. 37 is a cross-sectional view along line A-A of FIG. 36 showing the horizontally recessed nanosheet film removed from between the spacers of the device of FIGS. 32-35, in accordance with an embodiment of the present invention;

FIG. 38 is a cross-sectional view along line B-B of FIG. 36 showing the horizontally recessed nanosheet film removed from between the spacers of the device of FIGS. 32-35, in accordance with an embodiment of the present invention;

FIG. 39 is a cross-sectional view along line C-C of FIG. 36 showing the horizontally recessed nanosheet film removed from between the spacers of the device of FIGS. 32-35, in accordance with an embodiment of the present invention;

FIG. 40 is a top view showing gates, including a gate conductor and gate cap, formed between the gate spacers of the device of FIGS. 36-39, in accordance with an embodiment of the present invention;

FIG. 41 is a cross-sectional view along line A-A of FIG. 40 showing gates, including a gate conductor and gate cap, formed between the gate spacers of the device of FIGS. 36-39, in accordance with an embodiment of the present invention;

FIG. 42 is a cross-sectional view along line B-B of FIG. 40 showing gates, including a gate conductor and gate cap, formed between the gate spacers of the device of FIGS. 36-39, in accordance with an embodiment of the present invention;

FIG. 43 is a cross-sectional view along line C-C of FIG. 40 showing gates, including a gate conductor and gate cap, formed between the gate spacers of the device of FIGS. 36-39, in accordance with an embodiment of the present invention;

FIG. 44 is a top view showing source and drain contacts formed on the device of FIGS. 40-43, in accordance with an embodiment of the present invention;

FIG. 45 is a cross-sectional view along line A-A of FIG. 44 showing source and drain contacts formed on the device of FIGS. 40-43, in accordance with an embodiment of the present invention;

FIG. 46 is a cross-sectional view along line B-B of FIG. 44 showing source and drain contacts formed on the device of FIGS. 40-43, in accordance with an embodiment of the present invention;

FIG. 47 is a cross-sectional view along line C-C of FIG. 44 showing source and drain contacts formed on the device of FIGS. 40-43, in accordance with an embodiment of the present invention; and FIG. 48 is a block/flow diagram showing a system/method for forming the semiconductor device of FIGS. 44-47, in accordance with an embodiment of the present invention.

DETAILED DESCRIPTION

As chip sizes are driven smaller and smaller to increase performance and efficient, transistor pitch must become correspondingly smaller. However, as transistor pitch decreases, imperfections in the fabrication process such as etching and deposition becomes more and more important. For example, performing a gap fill between fins on a stacked nanowire or stacked nanosheet fin type field effect transistor (FinFET) results in less uniform fin and gate dimensions due to the imperfections and non-uniformity with the etching and deposition process of the gap fill. According to aspects of the present invention, a stacked nanowire/nanosheet FinFET is contemplated.

The stacked nanowire/nanosheet transistors includes a formation process whereby fins are formed from stacked nanosheets of at least two different nanosheet materials formed in alternating layers. Between the stacks of nanosheets and a substrate is a base nanosheet that is different from both the substrate and the alternating materials of the stack. Fins are formed from the stacks of alternating layers, with dummy gates formed over the fins.

By using the different base nanosheet, once the fins and dummy gate are formed, the base nanosheet may be selectively removed and replaced with an insulator or dielectric, thus isolating the fins and dummy gates from adjacent fins and dummy gates. Source and drain regions may then be formed around the dummy gates, with an ILD deposited over the device. The dummy gates may then be replaced with gates having a stacked nanowire/nanosheet construction. As a result, no gap fill process is required in forming the gates and the fins. Therefore, the non-uniformity of the etching and deposition of the gap fill process, which would ordinarily result in imperfections in the transistors, is unnecessary. The resulting device has fewer imperfections, with less tapering in the stacks of nanosheets. As a result, the fins can be reliably formed in smaller pitches. Thus, fabricating a stacked nanowire/nanosheet transistor becomes more precise and more reliable, resulting in better performance and higher yields.

Exemplary applications/uses to which the present invention can be applied include, but are not limited to: stacked nanowire and stacked nanosheet transistor fabrication, and FinFET fabrication processes.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C)

only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Figure 1:
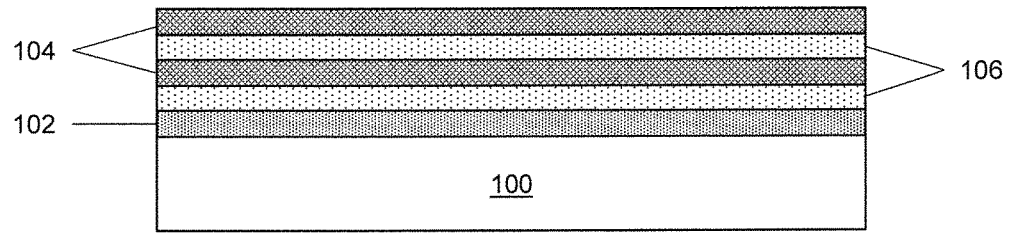
FIG. 1 is a cross-sectional view showing a film stack for producing a semiconductor device, in accordance with an embodiment of the present invention.

Referring now to the drawings in which like numerals represent the same or similar elements and initially to FIG. 1, illustrating a film stack for producing a semiconductor device, in accordance with an embodiment of the present invention.

According to aspects of the invention, forming the semiconductor device 10 may include forming a nanosheet stack of alternating layers of semiconducting material on a substrate 100, including a first nanosheet material 104 and a second nanosheet material 106. The substrate 100 may include, e.g. monocrystalline silicon (Si), however other suitable materials may be use (for example, silicon germanium (SiGe), gallium arsenide (GaAs), silicon carbide (SiC), polycrystalline silicon, and other group IV, III-V, II-VI and semiconducting materials). Additionally, the substrate may be a silicon-on-insulator substrate or a bulk substrate including an insulating layer or buried oxide (BOX) layer formed thereon.

Formed on the substrate 100 is the nanosheet stack of alternating materials. The materials may include at least two semiconducting materials with differing etch selectivity. As an example, the nanosheet stack may include a first nanosheet material 104 that may include Si, and a second nanosheet material 106, including a sacrificial semiconductor material such as, e.g., SiGe. The first nanosheet material 104 and the second nanosheet material 106 may be deposited in alternating fashion to form desired number of layered nanosheets (for example, two layers of each of the first nanosheet material 104 and the second nanosheet material 106).

Additionally, according to aspects of the invention, a base nanosheet 102 may be included. The footprint of the base nanosheet 102 may define an active area for the formation of transistors and other active components of the semiconductor device 10. The base nanosheet 102 may include a sacrificial material that is selectively etchable with both of the first nanosheet material 104 and the second nanosheet material 106. Accordingly, the base nanosheet 102 may include, e.g., SiGe having a different concentration of Ge from the second nanosheet material 106. For example, the base nanosheet 102 may include SiGe with a 50% Ge composition, while the second nanosheet material 106 may include SiGe with a 25% Ge composition. However, other material compositions are contemplate, such as SiC with different compositions of C, or SiC in the base nanosheet 102 and SiGe in the second nanosheet material 106, or other suitable material compositions for etch selectivity.

The first nanosheet material 104, second nanosheet material 106 and base nanosheet 102 may be formed with any suitable deposition process to permit accurate control of the height of each layer, such as physical vapor deposition (PVD), chemical vapor deposition (CVD), electrochemical deposition (ECD), molecular beam epitaxy (MBE) and atomic layer deposition (ALD) among others.

Figure 2:
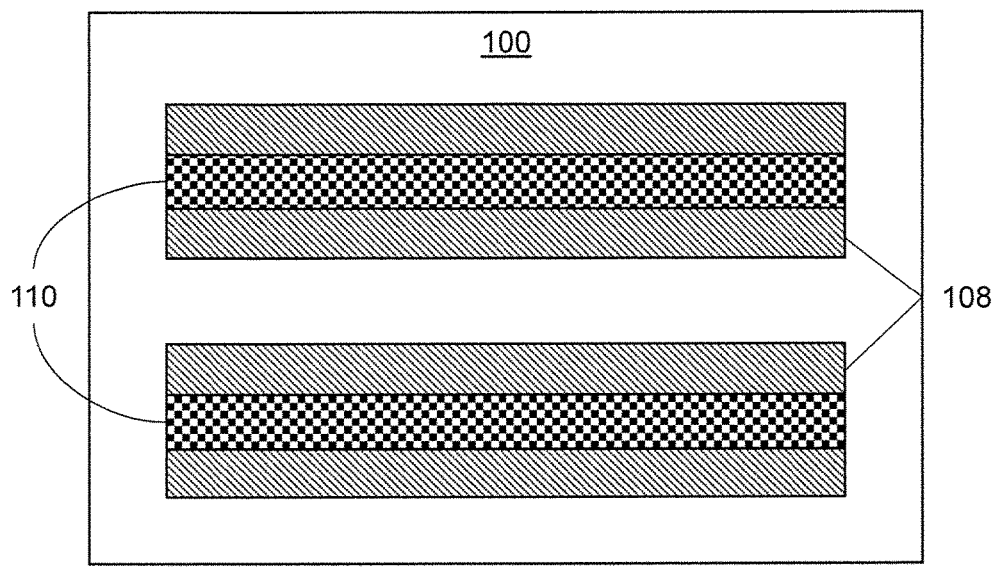
FIG. 2 is a top view showing a patterned active area of the film stack, in accordance with an embodiment of the present invention.
Figure 3:
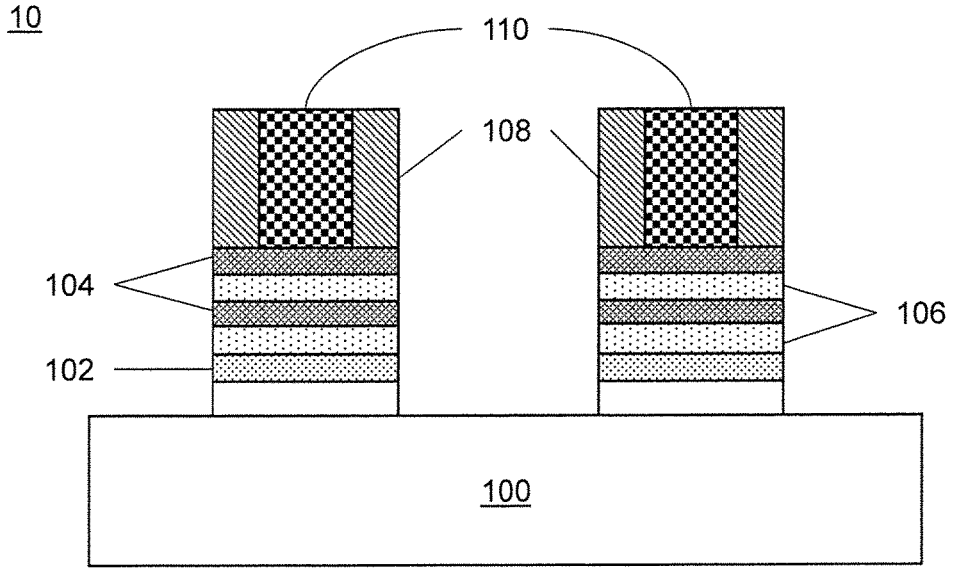
FIG. 3 is a cross sectional view showing a patterned active area of the film stack, in accordance with an embodiment of the present invention.

Referring now to FIGS. 2 and 3, illustrating a patterned active area of the film stack, in accordance with an embodiment of the present invention.

According to aspects of the invention, a stack of nanosheets, such as the stack described in reference to FIG. 1, may be patterned to form multiple regions of active areas on the semiconductor device 10. For example, the semiconductor device 10 may be patterned to have two or more active areas. The regions may be patterned out of a stack of the base nanosheet 102, first nanosheet material 104 and second nanosheet material 106 using, e.g., an etching process such as a wet etch, dry etch, or reactive-ion etch (RIE) process. The etching process may include recessing the substrate 100 below the base nanosheet 102 such that a top surface of the substrate 100 within the active area is above a top surface of the substrate 100 outside of the active area. Additionally, a lithographic process may be used to pattern the regions, or the regions may be separately deposited as independent nanosheet stacks.

Patterning the semiconductor device 10 may include forming an mandrel 110 and with sidewalls 108 on top of the stack of nanosheet material. The mandrel 110 may include a dielectric or semiconductor material, such as, e.g. amorphous carbon (C), Ge or boron nitride (BN), or other suitable material. The sidewalls 108 may include a nitride, such as a nitride used for a shallow trench isolation (STI) region. However, other materials may be used for the mandrels 110 and sidewalls 108 such that the mandrels 110 and sidewalls 108 are selectively etchable.

According to aspects of the invention, each sidewall 108 may ultimately correspond to a fin patterned into the first nanosheet material 104 and second nanosheet material 106, as will be described below. However, more sidewalls 108 may be formed on a stack of nanosheets by forming a plurality of mandrels 110 on a given stack through a suitable deposition process, and filling sidewalls 108 between each mandrel 110. Accordingly, as many sidewalls 108 as is desired may be formed, and thus any number of corresponding fins may be correspondingly formed.

Each region on the semiconductor device 10 includes the same layer structure (i.e. the same nanosheet stack materials with the same number and configuration of layers). The similarity between the two regions permits each region to be processed concurrently.

Figure 4:
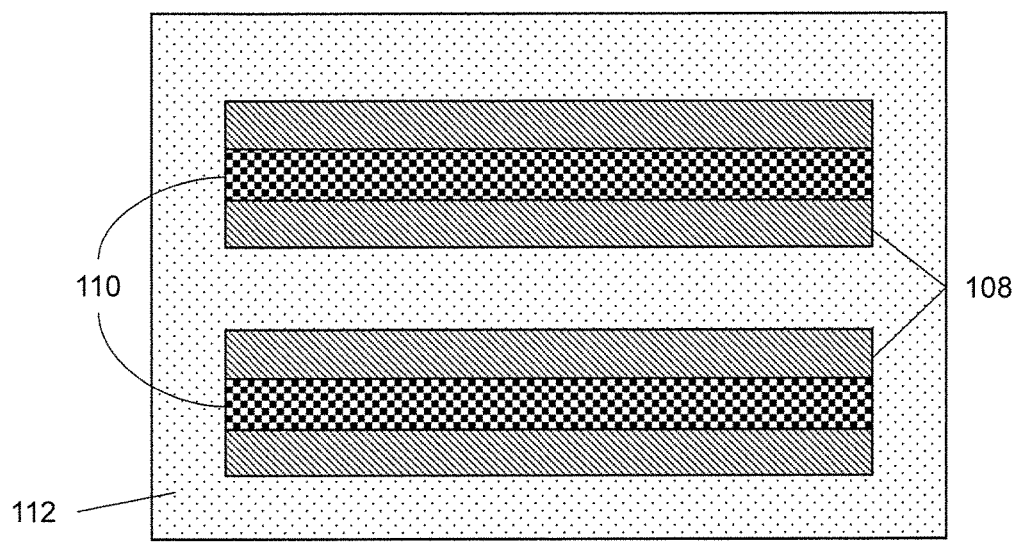
FIG. 4 is a top view showing a patterned active area having shallow trench isolation regions, in accordance with an embodiment of the present invention.
Figure 5:
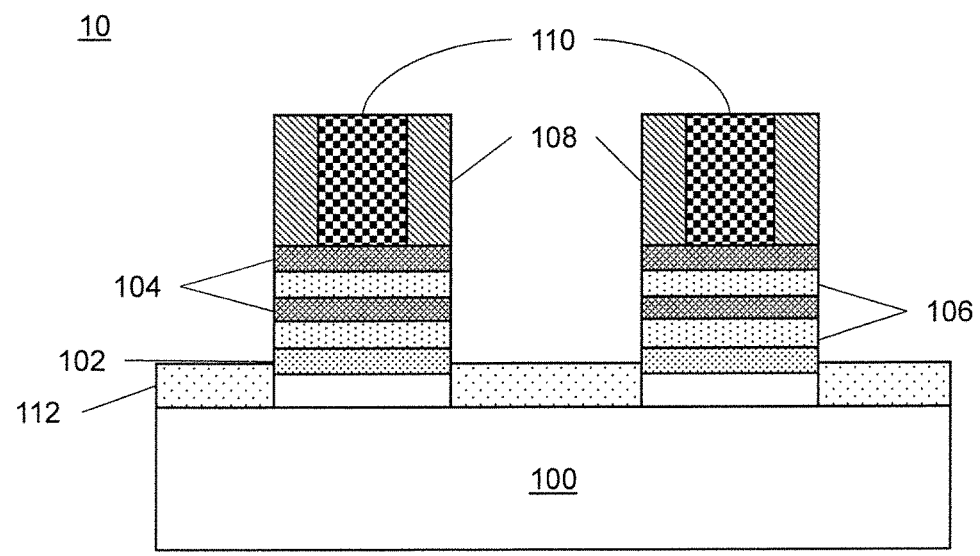
FIG. 5 is a cross-sectional view showing a patterned active area having shallow trench isolation regions, in accordance with an embodiment of the present invention.

Referring now to FIGS. 4 and 5, illustrating a patterned active area having shallow trench isolation regions, in accordance with an embodiment of the present invention.

According to aspects of the invention, a shallow trench isolation region (STI) 112 may be formed around each stack of the base nanosheet 102, first nanosheet material 104 and second nanosheet material 106. The STI 112 may be deposited to a height that leaves at least a portion of the base nanosheet 102 exposed above the STI 112. Alternatively, the STI 112 may be deposited and then recessed down to the desired height through a planarization process, such as, e.g., chemical-mechanical planarization (CMP). Thus, by recessing the substrate 100 below the base nanosheet 102, as described above, the STI 112 may be made thicker than would otherwise be possible, while maintaining a portion of the base nanosheet 102 above a top surface of the STI 112. Such a configuration permits a thicker STI 112, which improves isolation between active areas on the semiconductor device 10.

Figure 6:
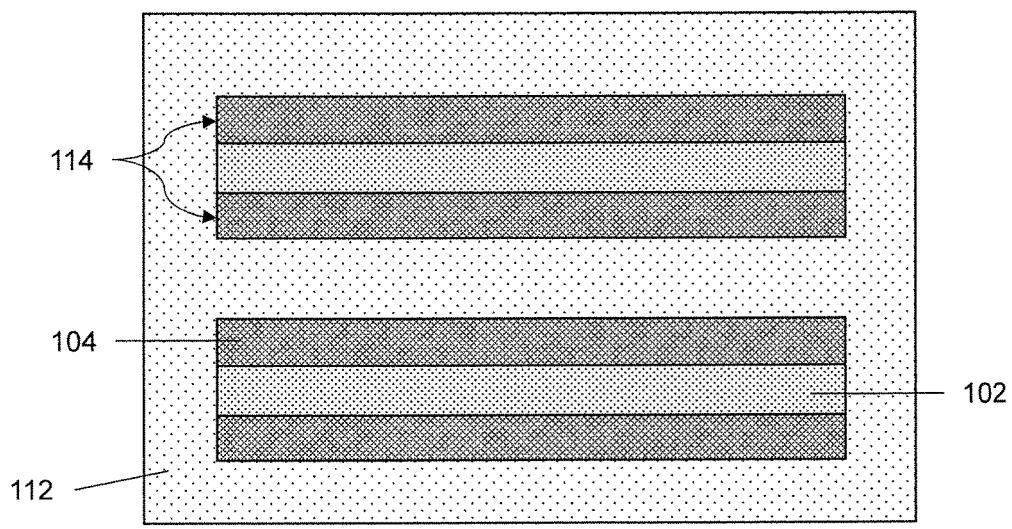
FIG. 6 is a top view showing the patterned active area of FIGS. 4 and 5 with fins patterned, in accordance with an embodiment of the present invention.
Figure 7:
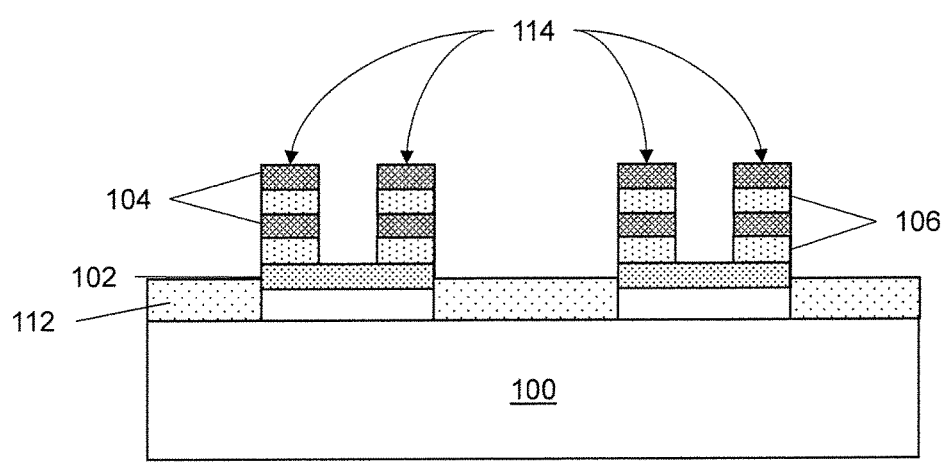
FIG. 7 is a cross-sectional view showing the patterned active area of FIGS. 4 and 5 with fins patterned, in accordance with an embodiment of the present invention.
Figure 8:
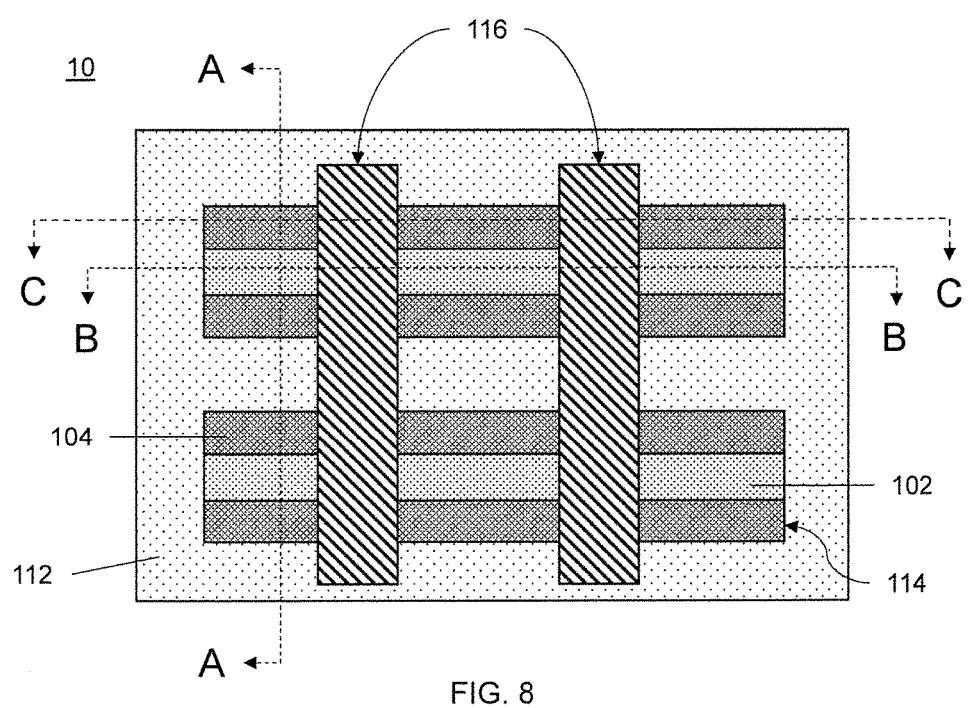
FIG. 8 is a top view showing a dummy gates formed on the active areas of the device of FIGS. 6 and 7, in accordance with an embodiment of the present invention.
Figure 9:
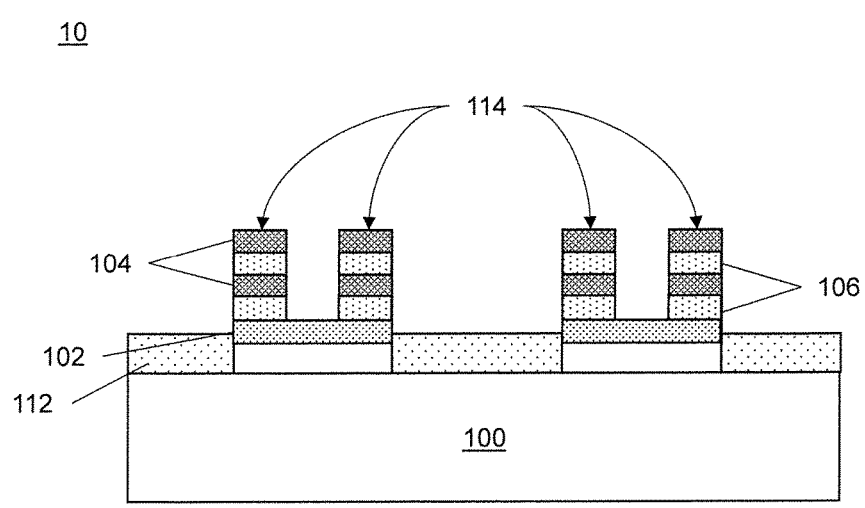
FIG. 9 is a cross-sectional view along line A-A of FIG. 8 showing a dummy gates formed on the active areas of the device of FIGS. 6 and 7, in accordance with an embodiment of the present invention.
Figure 10:
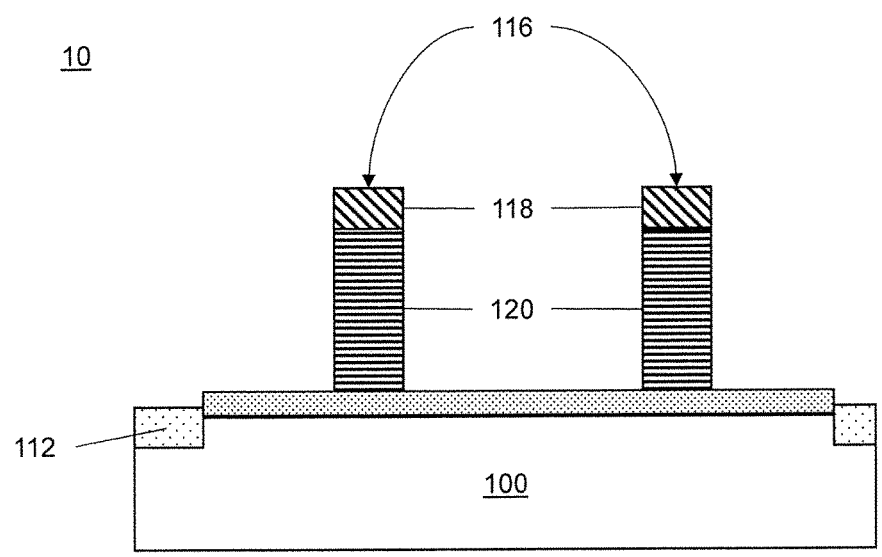
FIG. 10 is a cross-sectional view along line B-B of FIG. 8 showing a dummy gates formed on the active areas of the device of FIGS. 6 and 7, in accordance with an embodiment of the present invention.
Figure 11:
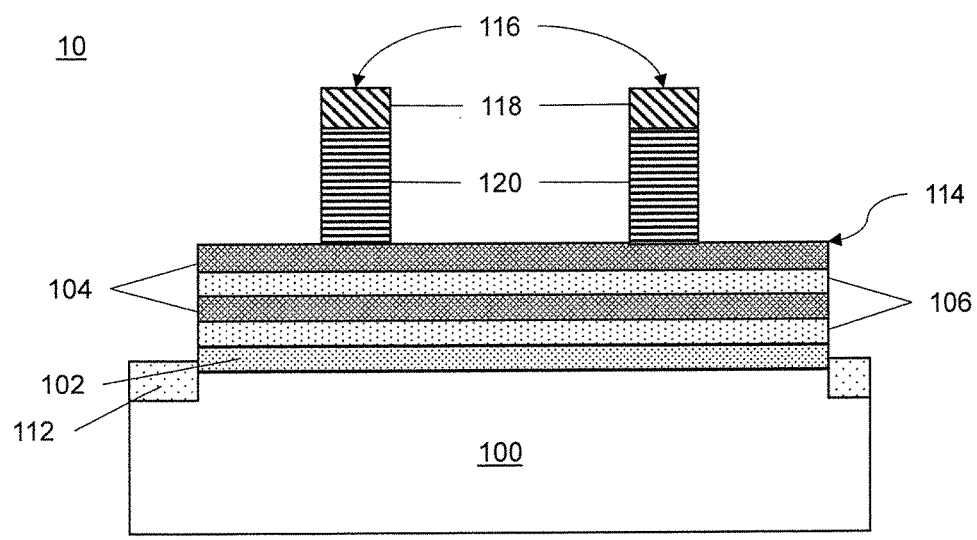
FIG. 11 is a cross-sectional view along line C-C of FIG. 8 showing a dummy gates formed on the active areas of the device of FIGS. 6 and 7, in accordance with an embodiment of the present invention.
Figure 12:
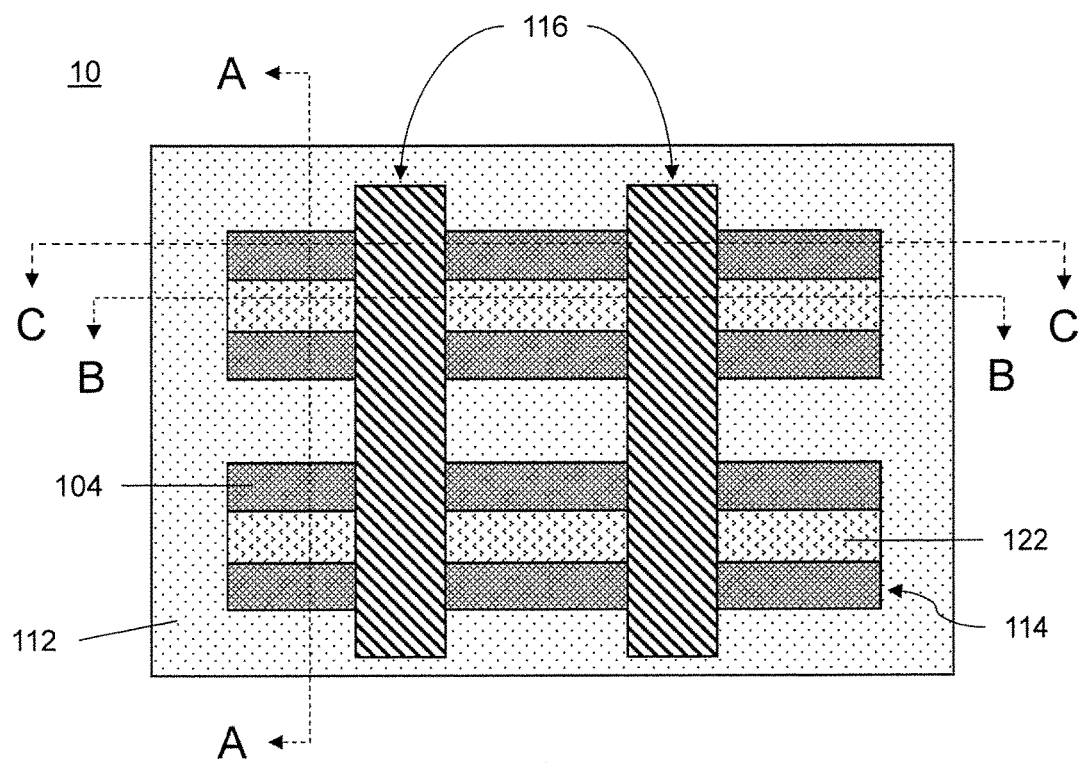
FIG. 12 is a top view showing a bottom nanosheet of the device of FIGS. 8-11 replaced with a blanket oxide, in accordance with an embodiment of the present invention.
Figure 13:
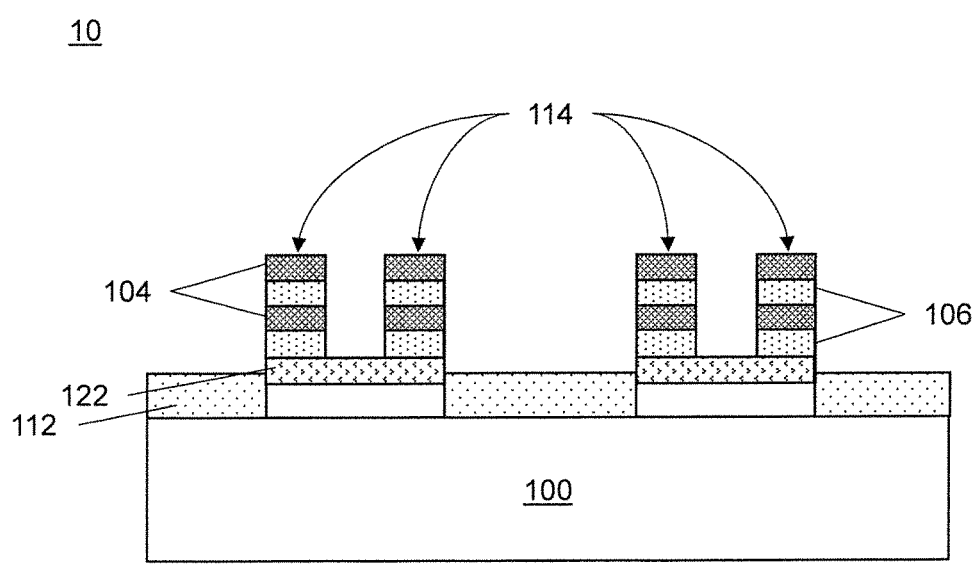
FIG. 13 is a cross-sectional view along line A-A of FIG. 12 showing a bottom nanosheet of the device of FIGS. 8-11 replaced with a blanket oxide, in accordance with an embodiment of the present invention.
Figure 14:
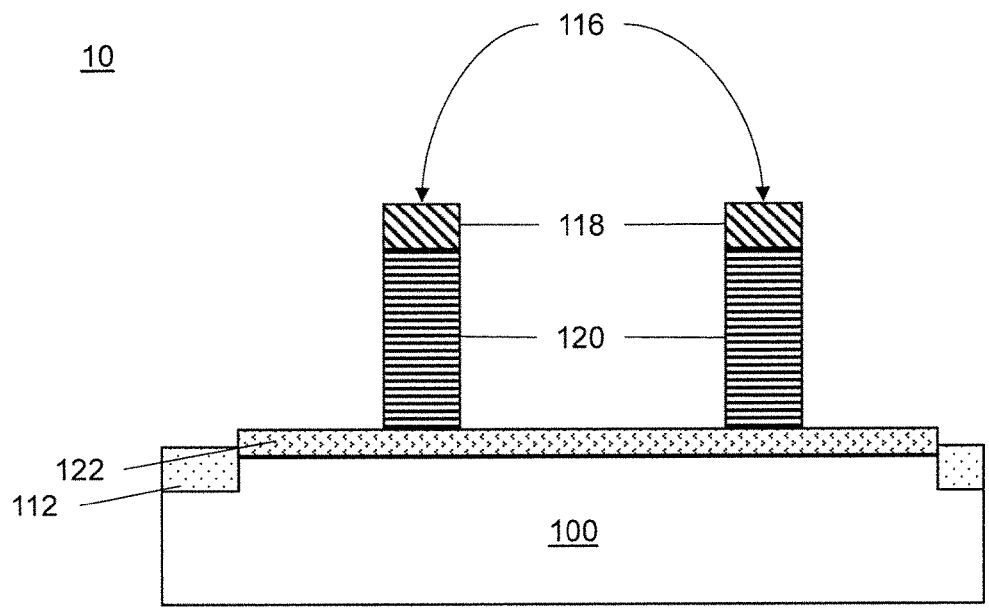
FIG. 14 is a cross-sectional view along line B-B of FIG. 12 showing a bottom nanosheet of the device of FIGS. 8-11 replaced with a blanket oxide, in accordance with an embodiment of the present invention.
Figure 15:
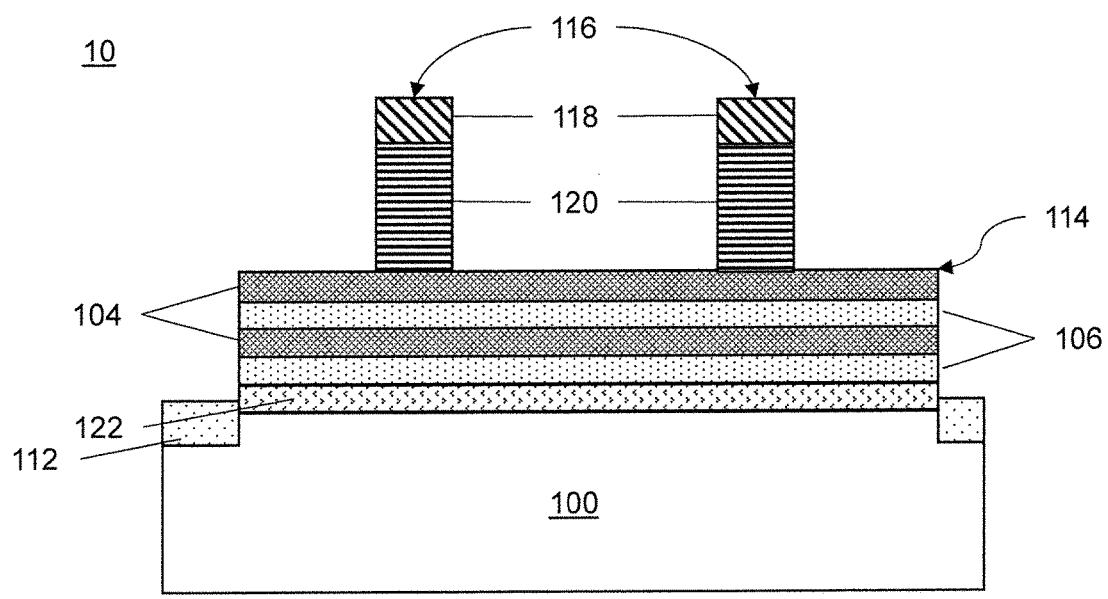
FIG. 15 is a cross-sectional view along line C-C of FIG. 12 showing a bottom nanosheet of the device of FIGS. 8-11 replaced with a blanket oxide, in accordance with an embodiment of the present invention.

Referring now to FIGS. 6 and 7, illustrating the patterned active area of FIGS. 4 and 5 with fins patterned, in accordance with an embodiment of the present invention.

According to aspects of the invention, fins 114 may be patterned onto the semiconductor device 10 on top of the base nanosheet 102. Each fin 114 includes a stack of the alternating first nanosheet material 104 and second nanosheet material 106 from the original stack.

The fins 114 may be formed through a series of etch processes, such as those described above. In particular, the mandrel 110 may be selectively etched down to the top layer of the first nanosheet material 104 or second nanosheet material 106, whichever is on top. For example, if a layer of the first nanosheet material 104 is the topmost layer of the stack of alternating nanosheet materials 104 and 106, then the mandrel 110 may be recessed down to the topmost first nanosheet material 104 layer. Each layer 104 and 106 of the nanosheet stack may then be selectively etched, using the sidewalls 108 and the STI 112 as an etch mask, until the base nanosheet 102 is exposed. Alternatively, an etch process that may etch each of the mandrel 110, first nanosheet material 104 and second nanosheet material selective to the sidewalls 108 and the STI 112 may be used to recess the mandrels 110 and stack down to the base nanosheet 102.

Additionally, the sidewalls 108 may be removed to expose the topmost layer of the stack of nanosheet materials 104 and 106. The sidewalls 108 may be removed, e.g. by an etch process, such as those described above, selective to each nanosheet material 102, 104 and 106. Or the sidewalls 108 may be removed through another suitable process, such as photolithography, or a planarization process (for example, chemical-mechanical planarization (CMP)).

Referring now to FIGS. 8-11, illustrating a dummy gates formed on the active areas of the device of FIGS. 6 and 7, in accordance with an embodiment of the present invention.

According to aspects of the invention, a step for forming a dummy gates 116 over the semiconductor device 10 may be includes. Each dummy gate 116 can include a single or multiple materials. For example, each dummy gate 116 may include a dummy gate dielectric (not shown) (e.g., silicon oxide), a dummy gate 120 (e.g., amorphous or polycrystalline silicon), and a dummy gate cap 118 (e.g., silicon nitride). The dummy gate cap 118 may include other nitrides, suitable to serve as a hardmask for subsequent process, as will be described below.

According to aspects of the invention, the dummy gate material 120 may be deposited by a suitable deposition process, such as those described above, and then planarized, and patterned, or a mask may be patterned and then the dummy gate material 120 may be deposited. The dummy gate cap 118 may then be deposited over the dummy gate material 120 by a suitable deposition process. By this or another suitable process, the dummy gates 116 may be formed on and around the fins 114, extending across the semiconductor device 10, perpendicular to the fins 114.

Referring now to FIGS. 12-15, illustrating a bottom nanosheet of the device of FIGS. 8-11 replaced with a blanket oxide, in accordance with an embodiment of the present invention.

According to aspects of the invention, a step is included for forming a blanket dielectric 122 beneath the fins 114. The blanket dielectric 122 may isolate one fin 114 from an adjacent fin 114 as well as from the substrate 100. The blanket dielectric 122 may therefore include a dielectric material such as, e.g., an oxide.

The blanket dielectric 122 may be formed by a replacement process to replace the base nanosheet 102. Such a process may include selectively etching the base nanosheet 102 using a suitable etch process, such as those described above. Because the base nanosheet 102 has a different composition from the first nanosheet material 104 and the second nanosheet material 106, the base nanosheet 102 may be etched selective to the first and the second nanosheet materials 104 and 106. For example, the first nanosheet material 104 may include a semiconductor material, such as Si. However, the second nanosheet material 106 and the base nanosheet 102 may include a different semiconductor material, such as, e.g., SiGe.

By forming the base nanosheet 102 from an SiGe compound having a different amount of Ge than an SiGe compound of the second nanosheet material 106, the base nanosheet 102 may be etched selective to both the first and the second nanosheet materials 104 and 106. For example, the second nanosheet material 106 may include, e.g., SiGe having 25% Ge, while the base nanosheet 102 may include, e.g., SiGe having 50% Ge. Thus, both of the base nanosheet 102 and the second nanosheet material 106 may include sacrificial SiGe while still be selective to each other.

Additionally, a space left by the removal of the base nanosheet 102 may be filled with a blanket dielectric material including any suitable oxide, as discussed above, to form the blanket dielectric 122. The blanket dielectric 122 may then be planarized and recessed by a suitable planarization process down to a suitable isolation level. Accordingly, the blanket dielectric 122 may form an STI between the fins 114 of the active regions on the semiconductor device 10. As a result, a more uniform STI is formed between the fins 114 without blocking of narrow regions.

Referring now to FIGS. 16-19, illustrating the fins 114 of the device of FIGS. 12-15 removed outside of a footprint of the dummy gates 116 with gate spacers 124 formed thereon, in accordance with an embodiment of the present invention.

Gate spacers 124 may be formed on each side of the dummy gates 116. The gate spacers 124 may be formed, e.g., according to a conformal deposition process where a layer of the gate spacer material is conformally deposited over the semiconductor device 10. The gate spacer material on horizontal surfaces is then removed, for example, by directional etch (e.g., reactive ion etch (RIE)), to leave only the vertical gate spacers 124.

The dummy gates 116 and their corresponding gate spacers 124 may be formed over the nanosheet stacks in each region of the semiconductor device 10. For example, the dummy gates 116, as depicted in FIG. 16, extends across the semiconductor device 10 perpendicular to, and beyond the fins 114. The dummy gates 116 and the gate spacers 124, therefore, wrap around the fins 114 in a perpendicular direction to the fins 114.

The dummy gate material 120 and material of the dummy gate caps 118 may be a different material from the gate spacer material of the gate spacers 124. As a result, the dummy gate material 120 may be etched selective to the gate spacers 124.

Upon forming the gate spacers 124, portions of the fins 114 may be removed from the semiconductor device 10 using the dummy gates 116 and gate spacers 124 as a mask. In other words, after etching, the nanosheet stack covered by dummy gates 116 and gate spacers 124 remain and nanosheet stack not covered by the dummy gates 116 and gate spacers 124 are removed. Thus that the fins 114 are patterned to only be under the dummy gates 116 and gate spacers 124.

Referring now to FIGS. 20-23, illustrating inner spacers 126 formed within recesses in the second nanosheet material 106 the device of FIGS. 16-19, in accordance with an embodiment of the present invention.

The second nanosheet material 106 may be recessed to from fin recesses. As a result, the second nanosheet material 106 extends to a lesser width than the gate spacers 124 in a width direction of the dummy gates 116, as depicted in FIGS. 22 and 23. The second nanosheet material 106 may be recessed by a suitable recessing process, such as selective etch of one of the types discussed above.

Upon recessing, inner spacers 128 may be formed within the recesses, as illustrated in FIGS. 22 and 23. The inner spacers 128 may be formed by a deposition process, such as those described above, and then recessed to be coextensive with an outside surface of the gate spacers 124 and the first nanosheet material 104. The inner spacers 128 may be recessed by a suitable recess process, such as a direction etch (e.g., RIE).

As a result, sides of each dummy gate 116 includes a gate spacer section 124, first nanosheet material 104 sections and inner spacer 128 sections down to the blanket dielectric 122. Accordingly, a stacked dummy gate is formed from each dummy gate 116.

Referring now to FIGS. 24-27, illustrating source and drain regions formed on the device of FIGS. 20-23, in accordance with an embodiment of the present invention.

According to aspects of the invention, a step includes forming source/drain regions 130 adjacent to the dummy gates 116. The source/drain regions 130 may occupy an area that is about the same in size and position to a footprint of the blanket dielectric 122 outside of the dummy gates 116. However, the source/drain regions 130 may also be either smaller than the footprint of the blanket dielectric 122, as long as the source/drain regions 130 abut the dummy gates 116.

The source/drain regions 130 may be formed from a metal, or other suitable conductor. According to aspects of the invention, the source/drain regions 130 are formed from silicon by an epitaxially growth process. However, other semiconductor materials may be used to form the source/drain regions 130. The silicon is grown from the sides of the dummy gates 116 and the gate spacers 124. Epitaxially growing the source/drain regions 130 improves the ability to control the portions of the dummy gate 116 that are left exposed due to greater control of dimensions of the source/drain regions 130. The source/drain regions 130 may be grown by an epitaxially process such as, e.g., molecular beam epitaxy (MBE), vapor phase epitaxy, solid phase epitaxy, liquid phase epitaxy, or other suitable growth process.

The epitaxially grown source/drain regions 130 may include a doped material that is doped, e.g. in situ, or through a separate process from the formation of the source/drain regions 130. In the latter case, the source/drain regions 130 may be doped through diffusion or by ion implantation, and may be performed using, e.g., a separate vapor phase epitaxy step. The epitaxial growth of the source/drain regions 130 may include a doping of ends of the first nanosheet material 104. The ends of the first nanosheet material 104 may be, e.g., n+ doped during the epitaxial growth process of the source/drain regions 130 by diffusion of the source/drain material into the first nanosheet material 104.

FIGS. 28-31, illustrating an interlevel dielectric layer (ILD) formed over the active areas of the device of FIGS. 24-27, in accordance with an embodiment of the present invention.

According to aspects of the invention, there may be a step for depositing an ILD 132 on the semiconductor device 10. The ILD 132 may be deposited by any suitable deposition process, such as those described above, such that the ILD 132 encompasses, and buries components of the semiconductor device 10. By encompassing the components of the semiconductor device 10, the ILD 132 insulates the various components from each other, thus reducing electrical interference between the components, such as each fin 114 in an active region. To further facilitate the electrical insulation of components, the ILD 132 may be formed, for example, of a, e.g., low-k dielectric material.

To smooth the surface topography of the ILD 132, and to expose the dummy gates 116, the ILD 132 may be planarized with a planarization process, including, e.g., chemical mechanical planarization (CMP), or any other suitable planarization process. Planarizing the ILD 132 down to the dummy gates 116 exposes the dummy gates, thus permitting access to the dummy gates 116 in subsequent processing.

Referring now to FIGS. 32-35, illustrating a removal of the dummy gates 116 of the device of FIGS. 28-31, in accordance with an embodiment of the present invention.

According to aspects of the invention, a step is included for removing the dummy gates 116 by a suitable etch process. The etch process may be any suitable selective etch process, such as those described above. The etch process may include forming a mask over the semiconductor device 10, patterned to expose the dummy gates 116.

Because the material of the gate caps 118 are different from the materials of the gate spacers 124, the dummy gates 116 may be etched according to the etch selectivity from the gate spacers 124. Accordingly, no masking step is required to perform the etching. As such, the dummy gate caps 118 may be etched selective to the gate spacers 124 by a suitable etch process. During this etch process, or in a subsequent etch, the dummy gate material 120 may also be selectively etched and recessed down to the topmost layer of the first nanosheet material 104 over the fins 114, and down to the blanket dielectric 122 between adjacent finds 114, and down to the STI 112 outside of adjacent fins 114. Accordingly, the dummy gate material 120 is entirely removed from between the gate spacers 124.

Referring now to FIGS. 36-39, illustrating the second nanosheet material 106 removed from between the gate spacers 124 of the device of FIGS. 32-35, in accordance with an embodiment of the present invention.

In another etch process, the second nanosheet material 106 is removed from between the gate spacers 124. Because the second nanosheet material 106 is a sacrificial material different from the first nanosheet material 104 and from the gate spacers 124, such as, e.g., SiGe, the second nanosheet material 106 may selectively etchable from those materials. Therefore, the second nanosheet material 106 may be removed by a selective etch process according to the etch selectivity. Accordingly, no masking step is required to perform the etching. As a result, the second nanosheet material 106 is entirely removed from between the gate spacers 124 and between the inner spacers 128, resulting a hollow stacked gate.

Referring now to FIGS. 40-43, illustrating gates, including a gate conductor and gate cap, formed between the gate spacers of the device of FIGS. 36-39, in accordance with an embodiment of the present invention.

According to aspects of the invention, a step is included for forming gates 134. Forming the gates 134 may include forming a dielectric layer 140 within the gate spacers 124 and inner spacers 128. This forms a dielectric layer 140 around the interior of the space between each set of the gate spacers 124.

The dielectric layer 140 may be any suitable dielectric material, including but not limited to, silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The dielectric layer 140 may be formed as part of a deposition process, such as those discussed above.

There may also be a step for forming a gate conductor 138 within the dielectric layer 140. The gate conductor 138 may be formed through a suitable deposition process, such as those discussed above. The gate conductor 138 is formed in-between the gate spacers 124 and the inner spacers 128, and between the first nanosheet material 104.

The gate conductor material can be any suitable conducting material, including but not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. In some embodiments, the gate conductor includes a workfunction metal layer to set the threshold voltage of the nanosheet transistor to a desired value. The work function layer may be a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

With the gates 134, a step may be included for forming gate caps 136. The gate caps 136 are formed by recessing the gate conductor 138 down to a desired height. An insulating material such as, e.g. an oxide or a nitride (for example, silicon nitride) is then deposited within the recess of each gate conductor 138 between the gate spacers 124. Accordingly, gates 134 are formed within the ILD 132 of the semiconductor device 10.

Referring now to FIGS. 44-47, illustrating source and drain contacts 142 formed on the device of FIGS. 40-43, in accordance with an embodiment of the present invention.

Source/drain contacts 142 may be formed on the semiconductor device 10. The source/drain contacts 142 may be formed concurrently by opening up the ILD 132 down to the source/drain regions 130. A conducting material or a combination of conducting materials may then be deposited into the openings of the ILD 132 down to the source/drain material in each region.

Accordingly, a plurality of stacked nanowire/nanosheet transistors are formed with the gates 134 driven by the source/drain contacts 142 through the source/drain regions 130. The stacked nanowire/nanosheet transistors may have a small pitch because a gap fill process was unnecessary to isolate the gates 134 and fins 114. Accordingly, the semiconductor device 10 may be made smaller while maintaining uniformity of each transistor. Thus, devices may be more reliably produces, resulting in higher yields and better device performance.

Referring now to FIG. 48, illustrating a block/flow diagram showing a system/method for forming the semiconductor device of FIGS. 44-47, in accordance with an embodiment of the present invention.

Block 201 includes a step for forming fins including alternating layers of at least two nanosheet materials on a base nanosheet in an active region. The at least two nanosheet materials may include two different material compositions, one of which is selectively etchable from the other. For example, one of the materials may include Si, while other includes SiGe having a 25% Ge composition. The base nanosheet may include a different material composition from each of the nanosheet materials. Accordingly, the base nanosheet may be selectively etchable with the two nanosheet materials. For example, the base nanosheet material may include SiGe with a 50% Ge composition.

Block 202 includes forming dummy gates over the active region. The dummy gates may include, e.g., a nitride hardmask as a cap over Si dummy gates.

Block 203 includes selectively etching the base nanosheet from under the fins. Because the base nanosheet includes a different material composition from any of the alternating nanosheet materials, the base nanosheet may be selectively etched, thus removing it from the active, and leaving a space under the fins and the dummy gates. The base nanosheet may be etched using any suitable etch process, as described above.

Block 204 includes filling under the fins with a blanket oxide, planarize the blanket oxide, and recess the blanket oxide down to an STI level. By filling under the fins and the dummy gates with a blanket oxide, the fins and the dummy gates may be effectively isolated from adjacent fins and adjacent dummy gates respectively.

Block 205 includes forming spacers on the dummy gates and etch fins outside of a footprint of the dummy gates and the spacers. For example, the dummy gates and spacers may be used as a hardmask to etch the fins from the active region other than directly beneath the dummy gates and spacers. Accordingly, the length of the fins correspond to the footprint of the dummy gates and spacers.

Block 206 includes recessing the sides of at least one of the nanosheet materials, and forming inner spacers on the recessed sides. Accordingly, a stacked nanowire/nanosheet dummy gate is formed.

Block 207 includes forming source/drain regions in the active region adjacent to the dummy gates. The source/drain regions may have a footprint that is coextensive with the footprint of the blanket dielectric within the active region. However, the source/drain regions may alternatively be smaller than the footprint of the blanket dielectric.

Block 208 includes replacing dummy gates and the at least one nanosheet material with a gate conductor, including a gate cap, to form gates. Replacing the dummy gates and the at least one nanosheet material may include recessing the dummy gate caps and etching through the dummy gates from between the gate spacers down to the fins and to the blanket dielectric with a suitable etch process. The at least one nanosheet material may be removed from between the gate spacers by selective etching due to the different material composition from other nanosheet materials. Accordingly a hollow stacked nanowire/nanosheet gate structure is formed. The hollow regions may then have a high-k dielectric liner deposited therein by a suitable deposition process to form a dielectric layer around interior surfaces of the hollow gate structure. The hollow gate structure may then be filled with a gate conductor by a suitable deposition process, such as those discussed above.

Block 209 includes forming source/drain contacts through an ILD down to the source/drain regions. Forming the source/drain contacts may include opening up an ILD down to source/drain regions adjacent to the gate spacers. The ILD may encompass the active region up to tops of the gate spacers. A conductive material may then be deposited in the openings down to the source/drain contacts.

Accordingly, a stacked nanowire/nanosheet transistor is formed with the gates driven by the source/drain contacts through the source/drain regions. The stacked nanowire/nanosheet transistor may have a small pitch with adjacent stacked nanowire/nanosheet transistors because a gap fill process was unnecessary to isolate the gates and fins. Accordingly, the semiconductor device may be made smaller while maintaining uniformity of each transistor. Thus, devices may be more reliably produces, resulting in higher yields and better device performance.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Having described preferred embodiments of a tight pitch stack nanowire without shallow trench isolation and method of forming a tight pitch stack nanowire without shallow trench isolation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a stacked nanowire transistor, comprising:
    forming a base nanosheet on a substrate;
    forming at least one fin, and at least one dummy gate over the at least one fin, on the base nanosheet, the at least one fin including at least two alternating layers of a first material and a second material;
    replacing the base nanosheet with a blanket dielectric to form a shallow trench isolation (STI) around the at least one fin and around the at least one dummy gate and having a substantially uniform thickness over the substrate; and
    performing a gate replacement to replace the at least one dummy gate and the second material with a gate conductor material and a gate cap to form gate structures.

2. The method of claim 1, wherein the base nanosheet is replaced with the blanket dielectric, including:
    etching the base nanosheet selective to each of the first material and the second material, such that the base nanosheet is removed and a cavity is formed beneath the at least one fin; and
    depositing a dielectric material beneath the cavity.

3. The method of claim 2, further including:
    planarizing the dielectric fill; and
    recessing the dielectric fill down to an STI level, such that the dielectric fill forms the blanket dielectric that isolates each of the at least one fin.

4. The method of claim 1, wherein the base nanosheet has a different material composition from each of the first material and the second material.

5. The method of claim 1, wherein the base nanosheet and the second material are both SiGe, each having different amounts of Ge.

6. The method of claim 1, wherein the base nanosheet defines an active area within which the at least one fin and the at least one dummy gate are formed.

7. The method of claim 6, wherein a top surface of the substrate outside of the active area is recessed below a stop surface of the substrate within the active area.

8. The method of claim 6, wherein the blanket dielectric replaces the base nanosheet in the entire active area.

9. The method of claim 1, wherein the gate structures are formed on top of the blanket dielectric such that each gate structure is isolated from the substrate and from each other gate structure by the blanket dielectric.

10. A method for forming a stacked nanowire transistor, comprising:

forming a base nanosheet on a substrate;

forming at least two fins, and at least one dummy gate over the at least two fins, on the base nanosheet, the at least two fins including at least two alternating layers of a first material and a second material;

etching the base nanosheet from beneath the at least two fins and the at least one dummy gate to form a cavity beneath the at least two fins and the at least one dummy gate;

filling the cavity with a blanket dielectric to form a shallow trench isolation (STI) beneath and between each of the at least two fins and beneath and around the at least one dummy gate and having a substantially uniform thickness over the substrate; and performing a gate replacement to replace the at least one dummy gate and the second material with a gate conductor material and a gate cap to form gate structures.

11. The method of claim 10, further including:
planarizing the blanket dielectric; and
recessing the blanket dielectric down to an STI level below the at least two fins, such that the blanket dielectric isolates each of the at least two fins.

12. The method of claim 10, wherein the base nanosheet has a different material composition from each of the first material and the second material.

13. The method of claim 10, wherein the base nanosheet and the second material are both SiGe, each having different amounts of Ge.

14. The method of claim 10, wherein the base nanosheet defines an active area within which the at least two fins and the at least one dummy gate are formed.

15. The method of claim 14, wherein the blanket dielectric replaces the base nanosheet in the entire active area.

16. The method of claim 15, wherein the gate structures are formed on top of the blanket dielectric such that each gate structure is isolated from the substrate and from each other gate structure by the blanket dielectric.

* * * * *